US008258054B2

(12) United States Patent
Ko

(10) Patent No.: US 8,258,054 B2
(45) Date of Patent: Sep. 4, 2012

(54) METHOD FOR FABRICATING SEMICONDUCTOR DEVICE

(75) Inventor: Eun-Jung Ko, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 86 days.

(21) Appl. No.: 12/648,650

(22) Filed: Dec. 29, 2009

(65) Prior Publication Data

US 2011/0151666 A1    Jun. 23, 2011

(30) Foreign Application Priority Data

Dec. 22, 2009   (KR) .................. 10-2009-0129037

(51) Int. Cl.
 *H01L 21/44* (2006.01)
(52) U.S. Cl. ................. 438/597; 438/242; 257/E21.167
(58) Field of Classification Search .................. 438/242, 438/259, 262, 597, 667; 257/E21.167
See application file for complete search history.

(56) References Cited

U.S. PATENT DOCUMENTS

2010/0301407 A1* 12/2010 Sung .............................. 257/329

FOREIGN PATENT DOCUMENTS

| KR | 1020110035686 | 4/2011 |
| KR | 101096187 | 12/2011 |
| KR | 101116360 | 3/2012 |

OTHER PUBLICATIONS

Notice of Preliminary Rejection issued from Korean Intellectual Property Office on May 17, 2011.
Notice of Allowance issued by the Korean Intellectual Property Office on May 18, 2012.

* cited by examiner

*Primary Examiner* — Thanhha Pham

(57) ABSTRACT

A method for fabricating a semiconductor device includes etching a substrate to form a plurality of trenches, forming first liner layers over bottom surfaces and inner sidewalls of the trenches to a first height, forming sacrificial liner layers on one of the inner sidewalls of the trenches where the first liner layers are formed, forming third sacrificial layers to a second height, so that the third sacrificial layers are buried over the trenches where the sacrificial liner layers are formed, removing portions of the sacrificial liner layers exposed by the third sacrificial layers to form sacrificial patterns, forming second liner layers on the inner sidewalls of the trenches exposed by the third sacrificial layers, and removing the third sacrificial layers to form side contact regions opening one of the inner sidewalls of the trenches in a line form.

19 Claims, 22 Drawing Sheets

METHOD FOR FABRICATING SEMICONDUCTOR DEVICE

CROSS-REFERENCE(S) TO RELATED APPLICATIONS

The present application claims priority of Korean Patent Application No. 10-2009-0129037, filed on Dec. 22, 2009, which is incorporated herein by reference in its entirety.

BACKGROUND OF THE INVENTION

Exemplary embodiments of the present invention relate to a method for fabricating a semiconductor device, and more particularly, to a method for fabricating a semiconductor device including a buried bit line coupled to a one side contact.

Typical metal-oxide-semiconductor field effect transistors (MOSFET) have limitations in improving the scale of integration due to leakage current, power-on current, and short channel effect caused by extreme micronization of devices. Therefore, a typical method has been suggested to use a vertical channel protruding from a substrate instead of a typical planar channel in order to overcome the limitations.

The structure and limitations of a typical vertical channel type semiconductor device are described in detail below in accordance with the drawings.

FIGS. 1A and 1B illustrate a structure of a typical vertical channel type semiconductor device. FIG. 1A illustrates a perspective view of the semiconductor device, and FIG. 1B illustrates a plan view of the semiconductor device.

Referring to FIGS. 1A and 1B, the typical vertical channel type semiconductor device includes a plurality of pillars 11 protruding from a substrate 10, a plurality of buried bit lines (BBL) extending parallel to each other along a first direction I-I', and a plurality of word lines (WL) extending parallel to each other along a second direction II-II' which intersects with the first direction I-I'.

In detail, the typical vertical channel type semiconductor device includes a plurality of pillar structures having the pillars 11 and hard mask layers 14 extending in a vertical direction. Each pillar 11 has a surrounding type gate electrode 13 forming the cylindrical surface, and a gate insulation layer 12 is formed on at an interface between each pillar 11 and its corresponding surrounding type gate electrode 13.

The buried bit lines are formed by implanting ions of impurities into the substrate 10. Trenches T are formed between adjacent buried bit lines. Although not shown, insulation layers are formed in the trenches T to isolate adjacent buried bit lines from each other.

The word lines couple the surrounding type gate electrodes 13 of the pillars 11 arranged along the second direction II-II' with each other. The word lines are extended to intersect with the buried bit lines.

However, according to the typical method shown above, there is a limitation as to reducing a resistance of the buried bit lines because the buried bit lines are formed by implanting dopants into the substrate 10 using the ion implantation process.

SUMMARY OF THE INVENTION

Exemplary embodiments of the present invention are directed to a method for fabricating a semiconductor device, which can reduce a resistance of buried bit lines.

In accordance with an embodiment of the present invention, a method for fabricating a semiconductor device includes etching a substrate including a cell region and an edge region to form a plurality of trenches, forming a first liner nitride layer over the surface profile of the trenches, removing portions of the first liner nitride layer formed on one of inner sidewalls of the trenches in the cell region to form side contact regions, which open one of the inner sidewalls of the trenches in the cell region in a line form, and forming a side contact conductive layer over the surface profile of the trenches.

In accordance with another embodiment of the present invention, a method for fabricating a semiconductor device includes etching a substrate to form a plurality of trenches, forming first liner layers over bottom surfaces and inner sidewalls of the trenches to a first height, forming sacrificial liner layers on one of the inner sidewalls of the trenches where the first liner layers are formed, forming third sacrificial layers to a second height, so that the third sacrificial layers are buried over the trenches where the sacrificial liner layers are formed, removing portions of the sacrificial liner layers exposed by the third sacrificial layers to form sacrificial patterns, forming second liner layers on the inner sidewalls of the trenches exposed by the third sacrificial layers, and removing the third sacrificial layers to form side contact regions opening one of the inner sidewalls of the trenches in a line form.

In accordance with yet another embodiment of the present invention, a method for fabricating a semiconductor device includes etching a substrate including a cell region and an edge region to form a plurality of trenches, forming a first liner layer over the surface profile of the trenches, forming first sacrificial layers to a first height over the trenches, forming a mask pattern covering the edge region, removing portions of the first liner layer exposed by the first sacrificial layers and the mask pattern, forming sacrificial liner layers on first inner sidewalls of the trenches in the cell region, removing the first sacrificial layers, forming third sacrificial layers to a second height which is higher than the first height, so that the third sacrificial layers are buried over the trenches, removing portions of the sacrificial liner layers exposed by the third sacrificial layers to form sacrificial patterns in a line form on second inner sidewalls of the trenches in the cell region, where the second inner sidewalls of the trenches are opposite sidewalls of the same trench as the first inner sidewalls, forming second liner layers on the first and second inner sidewalls of the trenches exposed by the third sacrificial layers, and removing the third sacrificial layers to form side contact regions opening the first inner sidewalls of the trenches in the cell region in a line form.

In accordance with still another embodiment of the present invention, a method for fabricating a semiconductor device includes etching a substrate to form a plurality of trenches, forming first liner layers over bottom surfaces and inner sidewalls of the trenches to a first height, forming side contact conductive layers on first inner sidewalls of the trenches exposed by the first liner layers, forming third sacrificial layers to a second height which is higher than the first height, so that the third sacrificial layers are buried over the trenches where the side contact conductive layers are formed, and removing portions of the side contact conductive layers exposed by the third sacrificial layers to form side contacts in a line form on second inner sidewalls, opposite from the first inner sidewalls, of the trenches.

In accordance with still another embodiment of the present invention, a method for fabricating a semiconductor device includes etching a substrate including a cell region and an edge region to form a plurality of trenches, forming a first liner layer over the surface profile of the trenches, forming first sacrificial layers over the trenches to a first height, forming a mask pattern covering the edge region, removing portions of the first liner layer exposed by the first sacrificial layers and the mask pattern, forming side contact conductive layers on one of the inner sidewalls of the trenches in the cell region, forming third sacrificial layers to a second height which is higher than the first height, so that the third sacrificial layers are buried over the trenches, and removing portions of the side contact conductive layers exposed by the third sacrificial layers to form side contacts in a line form on one of the inner sidewalls of the trenches.

DESCRIPTION OF SPECIFIC EMBODIMENTS

Figure 1A:
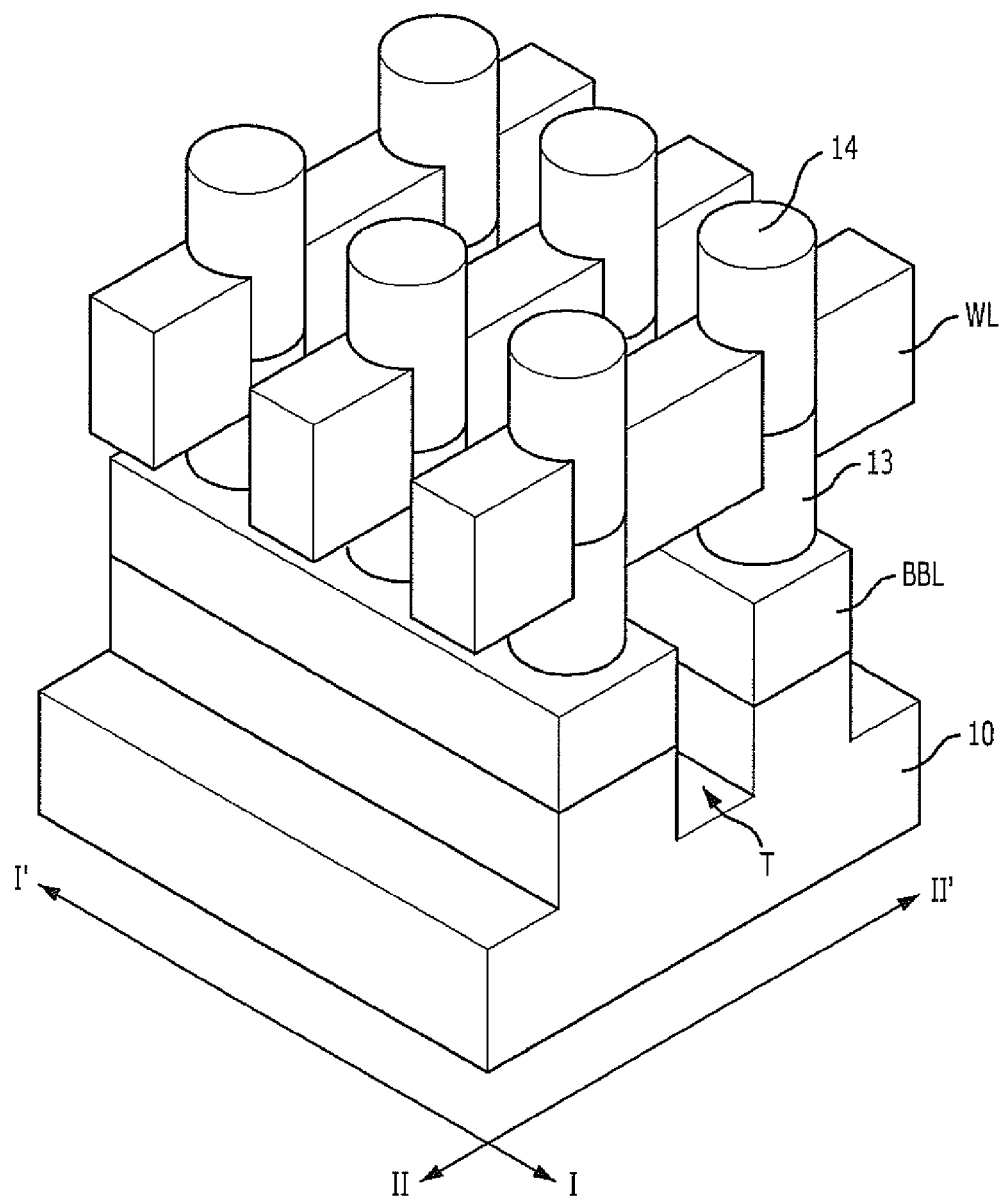
FIGS. 1A and 1B illustrate a structure of a typical vertical channel type semiconductor device.
Figure 1B:
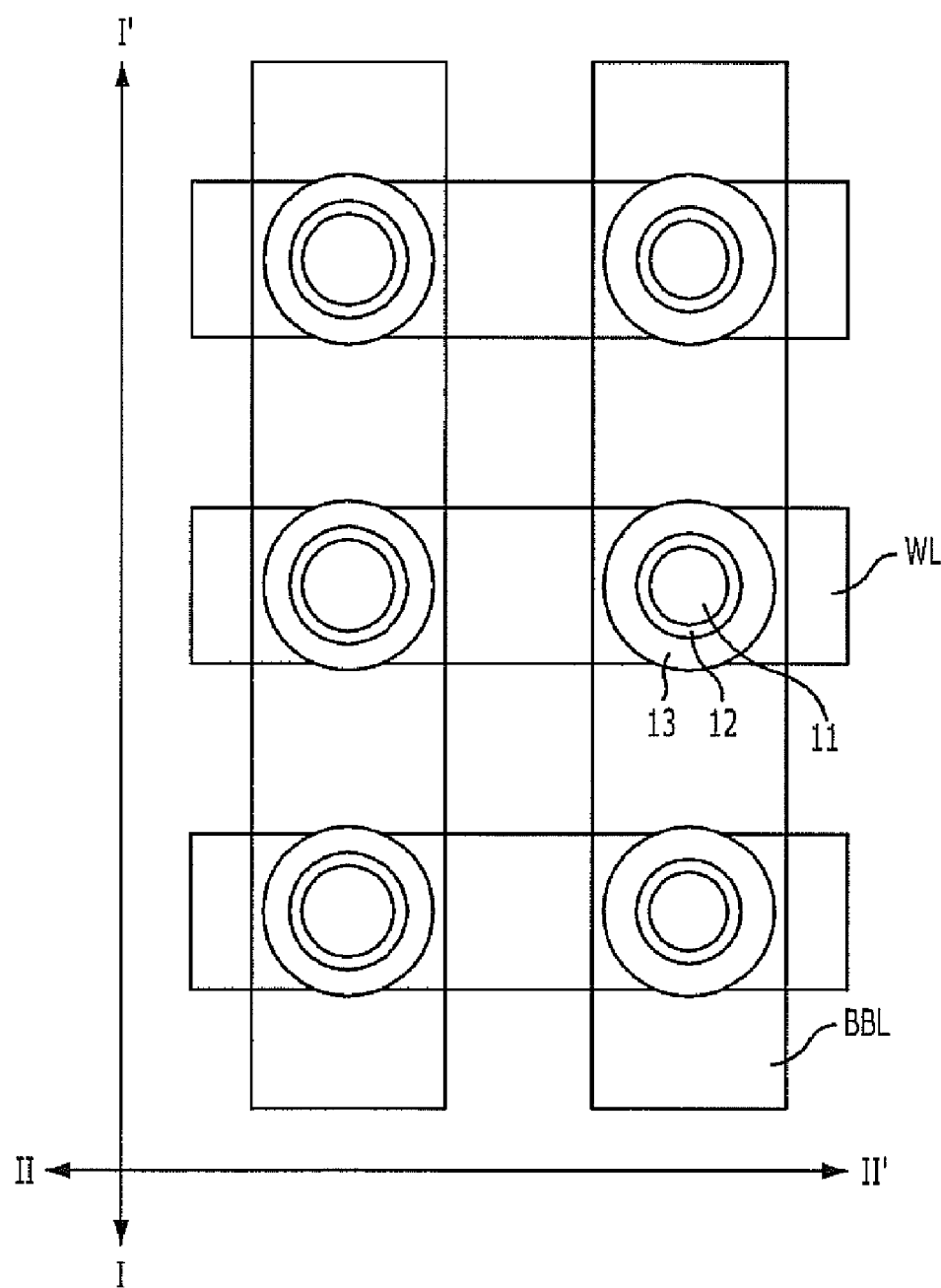

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate, but also a case where a third layer exists between the first layer and the second layer or the substrate.

FIGS. 2A to 11B illustrate perspective views of a method for fabricating a semiconductor device in accordance with a first embodiment of the present invention. FIGS. 2A, 3A, 4A, 5A, 6A, 7A, 8A, 9A, 10A, and 11A represent cell regions, and FIGS. 2B, 3B, 4B, 5B, 6B, 7B, 8B, 9B, 10B, and 11B represent edge regions.

Figure 2A:
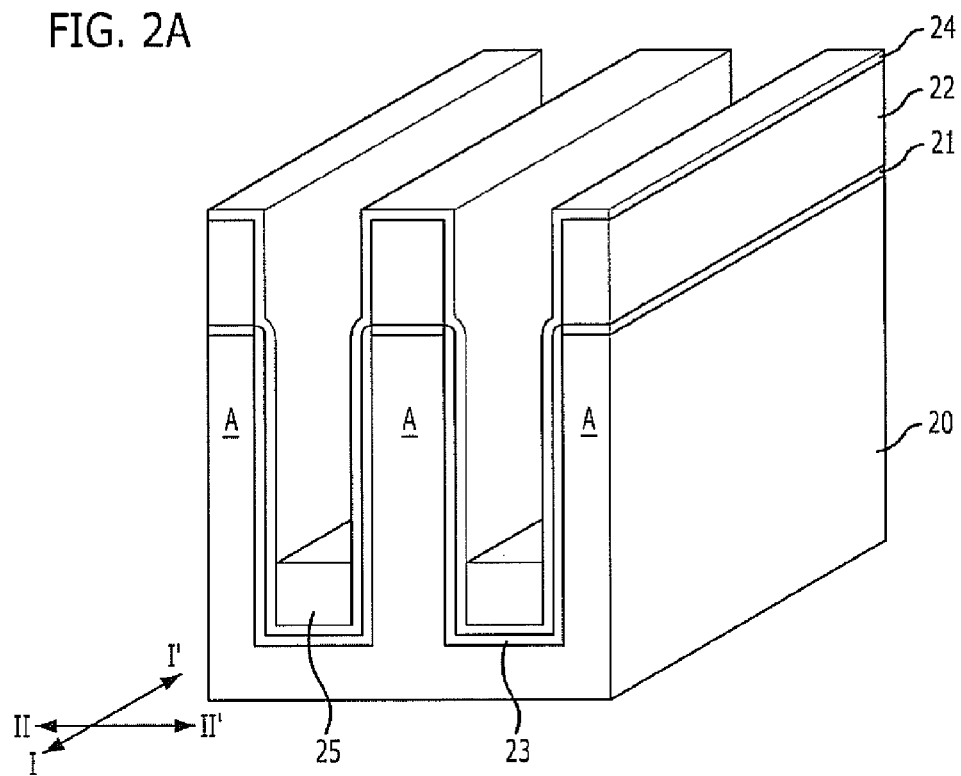
FIGS. 2A to 11B illustrate perspective views of a method for fabricating a semiconductor device in accordance with a first embodiment of the present invention.
Figure 2B:
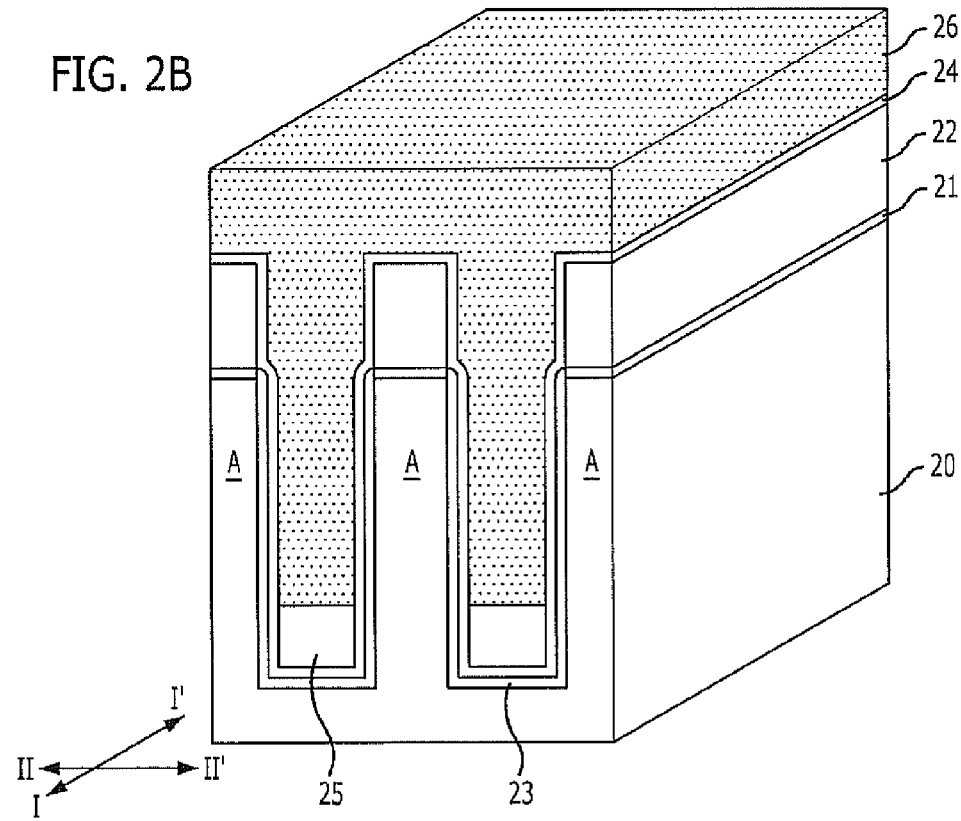

Referring to FIGS. 2A and 2B, a substrate 20 including a cell region and an edge region is formed. The cell region is a region where memory cells for storing data are to be formed. The edge region is a region where pads for contact are to be formed.

A padding pattern 21 and a hard mask 22 are formed over the substrate 20 including the cell region and the edge region. In detail, a padding layer and a hard mask layer are formed over the substrate 20 including the cell region and the edge region. For instance, the padding layer includes an oxide-based layer, and the hard mask layer includes a nitride-based layer.

A mask pattern (not shown) for forming buried bit lines is formed over the hard mask layer. For instance, the mask pattern for forming buried bit lines includes a plurality of line type patterns extending parallel to each other along a first direction I-I'.

The hard mask layer and the padding layer are etched using the mask pattern for forming buried bit lines as an etch barrier, and the substrate 20 is etched to a certain depth to form a plurality of trenches for forming buried bit lines. The trenches for forming buried bit lines are referred to as trenches hereinafter. For instance, the trenches are formed to a depth ranging from approximately 2,000 Å to approximately 3,000 Å. As a result, the padding pattern 21 and the hard mask 22 are formed.

Consequently, a plurality of active regions A isolated from each other by the trenches and extending parallel to each other along the first direction I-I' are defined. In this embodiment of the present invention, side contacts in a line pattern are formed on sidewalls of the active regions A (i.e., on one of the inner sidewalls of the trenches) using subsequent processes to couple the active regions A and buried bit lines.

A wall oxidation process is performed to form sidewall oxide layers 23 on exposed inner sidewalls and bottom surfaces of the trenches.

A first liner layer 24 is formed over the surface profile of the substrate structure. For instance, the first liner layer 24 may include a liner nitride layer.

A first sacrificial layer is formed over the substrate structure. For instance, the first sacrificial layer may include a polysilicon layer.

A planarization process is performed until surfaces of the first liner layer 24 are exposed. An etch-back process is performed in a manner that the etched first sacrificial layer remains up to a first height from the bottom surfaces of the trenches. For instance, the first height ranges from approximately 200 Å to approximately 800 Å from the bottom surfaces of the trenches. Consequently, patterned first sacrificial layers 25 are formed.

Figure 2C:
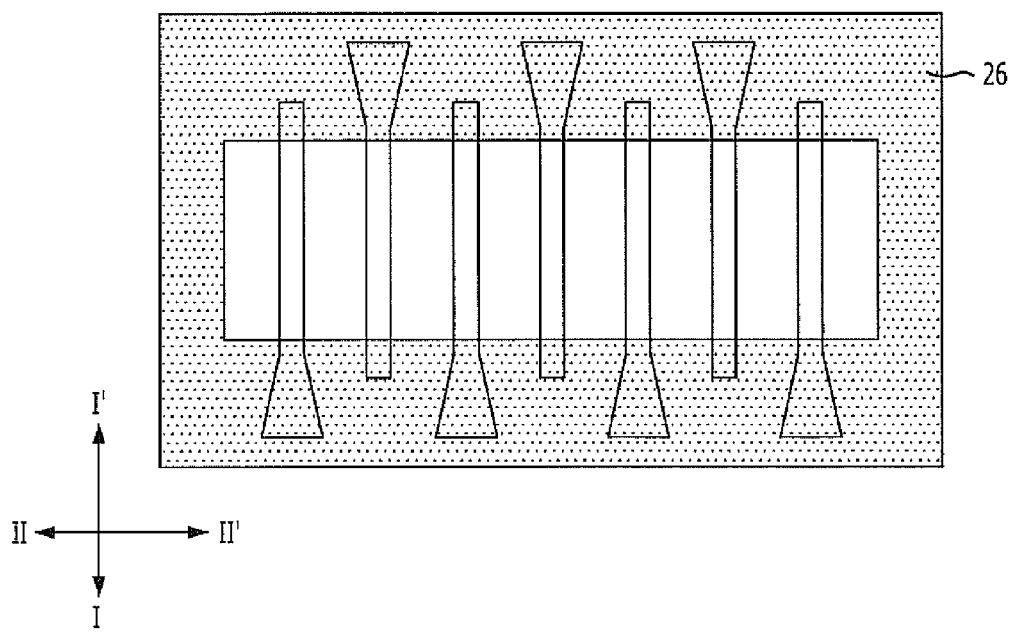

A first mask pattern 26 covering the edge region is formed. FIG. 2C illustrates a plan view of the substrate structure after the first mask pattern 26 is formed. Referring to FIG. 2C, the first mask pattern 26 is formed in a manner so that the first mask pattern 26 covers the edge region while having an opening to expose the cell region. For instance, the first mask pattern 26 may include a photoresist pattern.

Figure 3A:
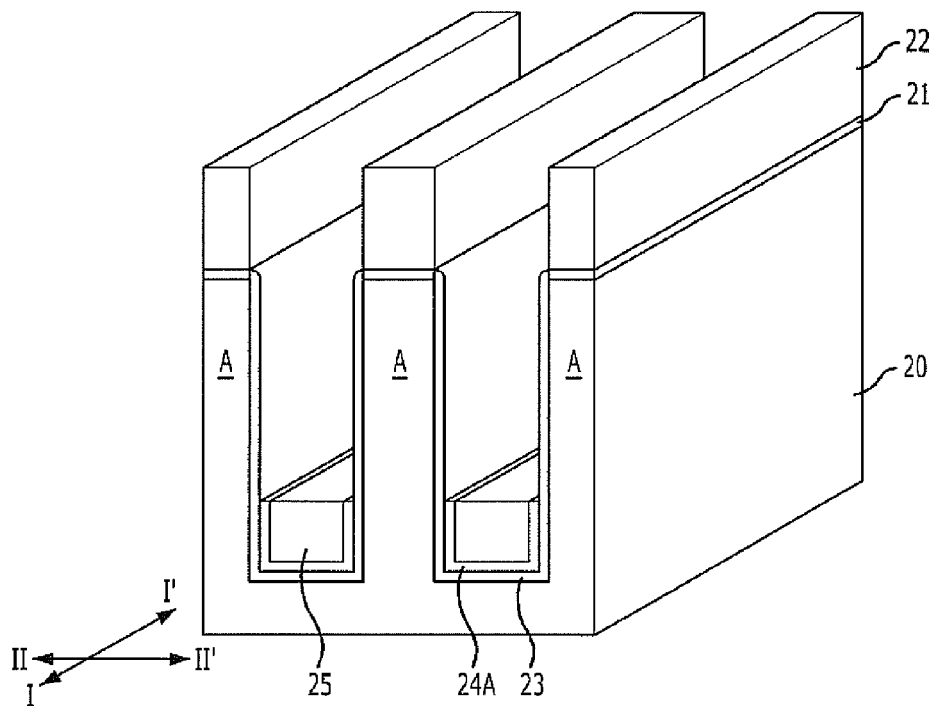
Figure 3B:
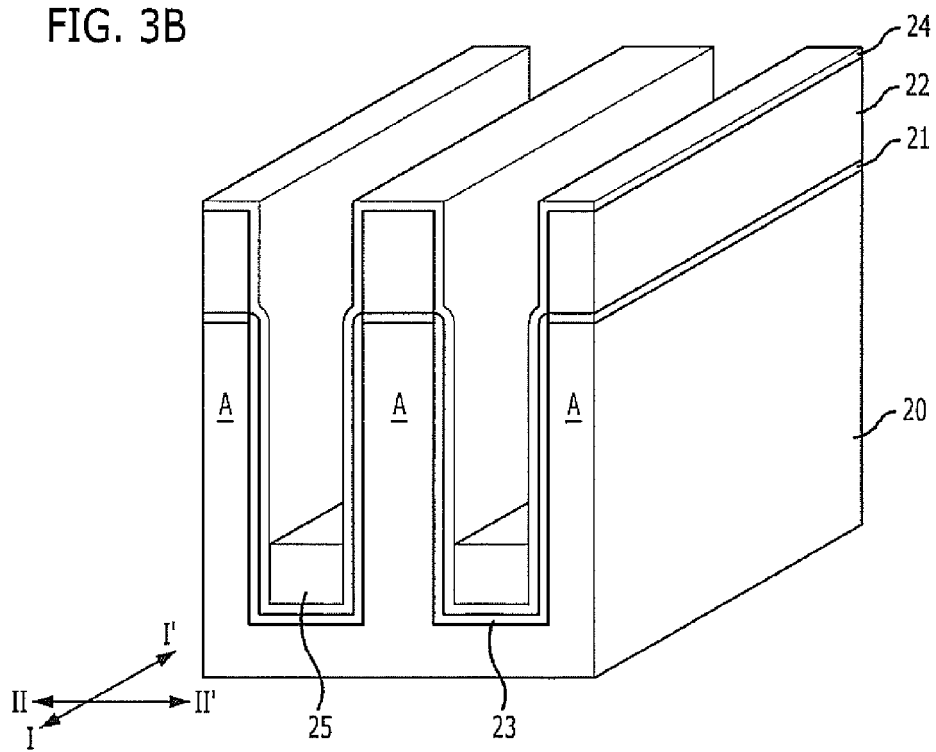

Referring to FIGS. 3A and 3B, exposed portions of the first liner layer 24 are removed using the patterned first sacrificial layers 25 and the first mask pattern 26 as an etch barrier.

For instance, the exposed portions of the first liner layer 24 are removed using a dry or wet removal process. For example, the removal process may be performed using phosphoric acid ($H_3PO_4$) at a temperature ranging from approximately 100° C. to approximately 200° C. for approximately 50 seconds to approximately 200 seconds.

At this time, portions of the first liner layer 24 formed on upper inner sidewalls of the trenches in the cell region are removed, while the first liner layer 24 formed over the trenches in the edge region remains after the removal process. Also at this time, portions of the first liner layer 24 formed where the patterned first sacrificial layers 25 are buried over the trenches in the cell region remain after the removal process. Reference denotation 24A represents remaining first liner layers 24A in the cell region.

Consequently, the remaining first liner layers 24A are formed over the bottom surfaces and inner sidewalls of the trenches in the cell region to the first height, while the first liner layer 24 is formed over the entire surface of the trenches in the edge region. Therefore, when forming a subsequent doped polysilicon layer for forming subsequent side contacts and performing a thermal treatment process, the first liner layer 24 functions as a barrier in the edge region to prevent formation of junctions through dopant diffusion in the edge region. In other words, the junctions are formed in the cell region, but not in the edge region.

Figure 4A:
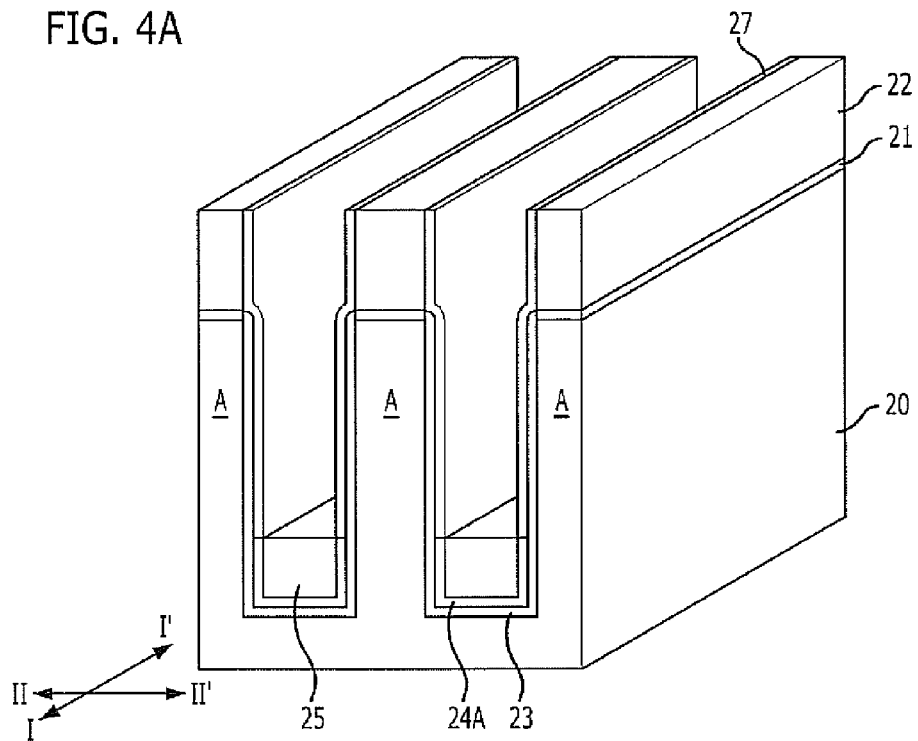
Figure 4B:
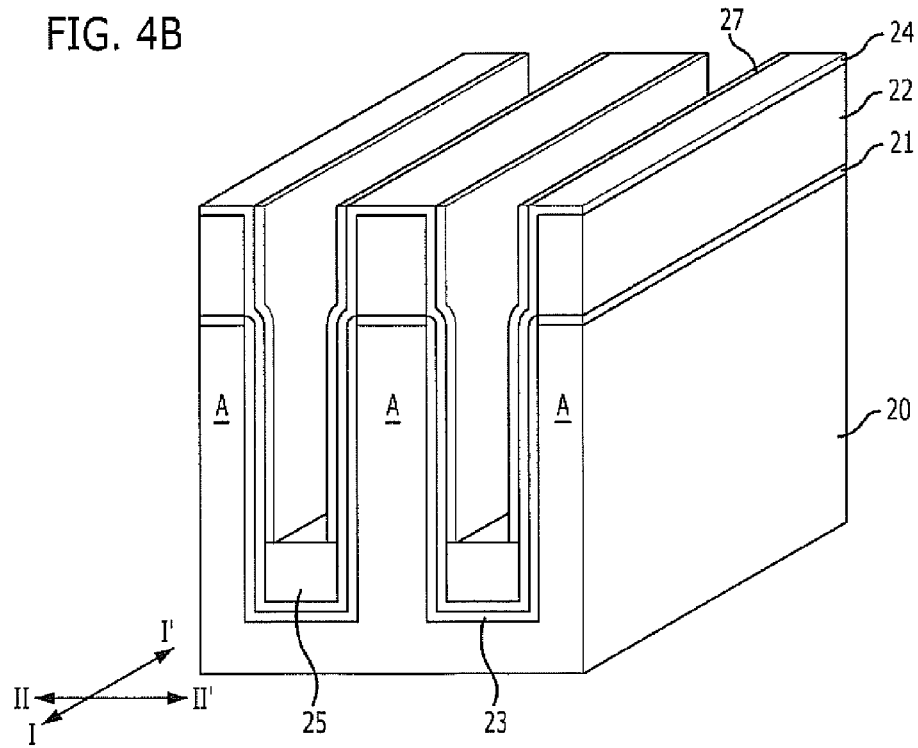

Referring to FIGS. 4A and 4B, a sacrificial liner layer is formed over the surface profile of the trenches. For instance, the sacrificial liner layer has a thickness ranging from approximately 10 Å to approximately 200 Å.

An anisotropic etch process is performed to remove portions of the sacrificial liner layer formed over the bottom surfaces of the trenches and upper portions of the hard mask 22. Consequently, patterned sacrificial liner layers 27 are formed over the inner sidewalls of the trenches.

The patterned sacrificial liner layers 27 are formed to form sacrificial patterns on inner sidewalls of the trenches in the cell region. In this embodiment of the present invention, the sacrificial patterns are formed on the inner sidewalls of the trenches using the patterned sacrificial liner layers 27, and the sacrificial patterns are used to form side contacts on portions of one of the inner sidewalls of the trenches corresponding to the sacrificial patterns.

For instance, the patterned sacrificial liner layers 27 include a material having a high etch selectivity with respect to the first liner layer 24, the remaining first liner layers 24A, and the sidewall oxide layers 23. For example, the patterned sacrificial liner layers 27 may include titanium nitride (TiN), cobalt (Co), and nickel (Ni).

Figure 5A:
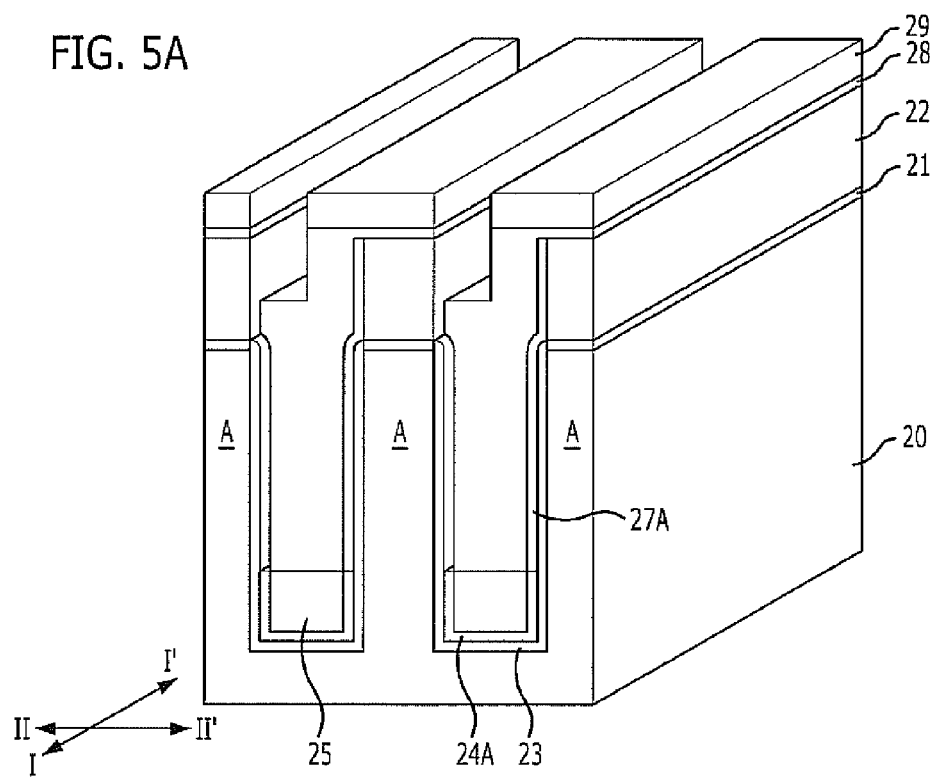
Figure 5B:
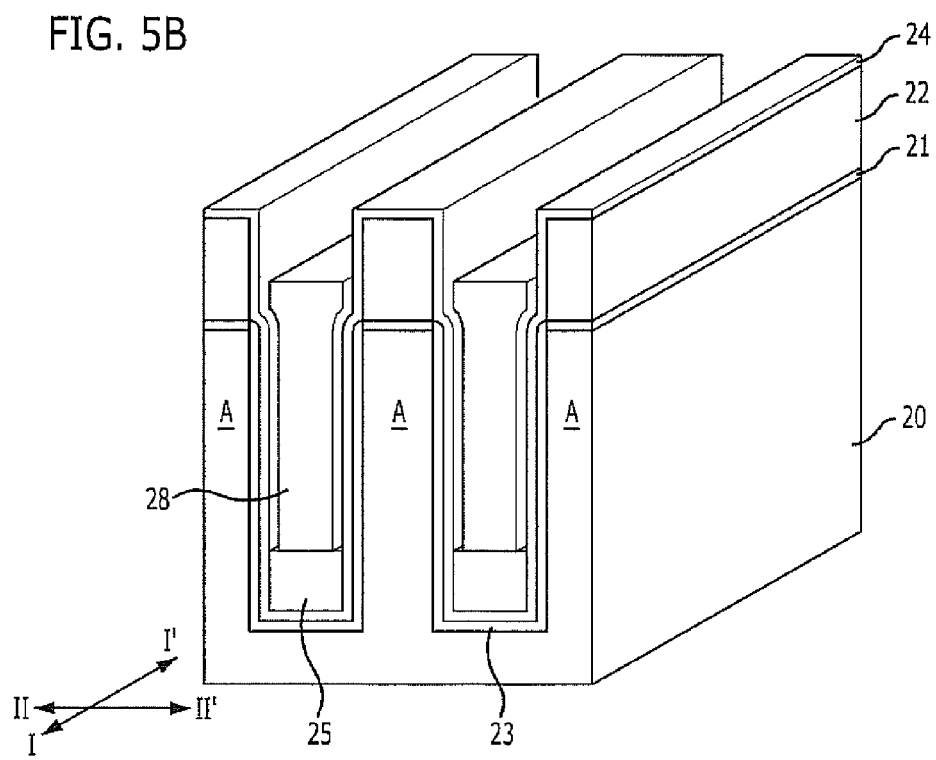

Referring to FIGS. 5A and 5B, a second sacrificial layer is buried over the trenches. For instance, the second sacrificial layer may include a polysilicon layer.

A planarization process is performed in a manner that the planarized second sacrificial layer remains to a certain thickness over the upper portions of the hard mask 22.

A second mask pattern 29 is formed over the planarized second sacrificial layer to cover only one of the inner sidewalls of the trenches in the cell region. For instance, the second mask pattern 29 includes a photoresist pattern, which is formed to expose one of the inner sidewalls of the trenches in the cell region, as well as, the trenches in the edge region.

The planarized second sacrificial layer is etched to a certain thickness to expose portions of the patterned sacrificial liner layers 27 using the second mask pattern 29 as an etch barrier. Thus, patterned second sacrificial layers 28 are formed. At this time, portions of the patterned sacrificial liner layers 27 formed over one of the inner sidewalls of the trenches in the cell region and the patterned sacrificial liner layers 27 formed over the trenches in the edge region are exposed.

Next, for instance, a cleaning process is performed before the exposed portions of the patterned sacrificial liner layers 27 are removed.

The exposed portions of the patterned sacrificial liner layers 27 are removed using the second mask pattern 29 as an etch barrier. For instance, the exposed portions of the patterned sacrificial liner layers 27 may be removed using a wet dip out process.

At this time, the portions of the patterned sacrificial liner layers 27 formed over one of the inner sidewalls of the trenches in the cell region and the patterned sacrificial liner layers 27 formed over the trenches in the edge region are removed. Reference denotation 27A represents remaining sacrificial liner layers 27A remaining on the other inner sidewalls of the trenches in the cell region.

Figure 6A:
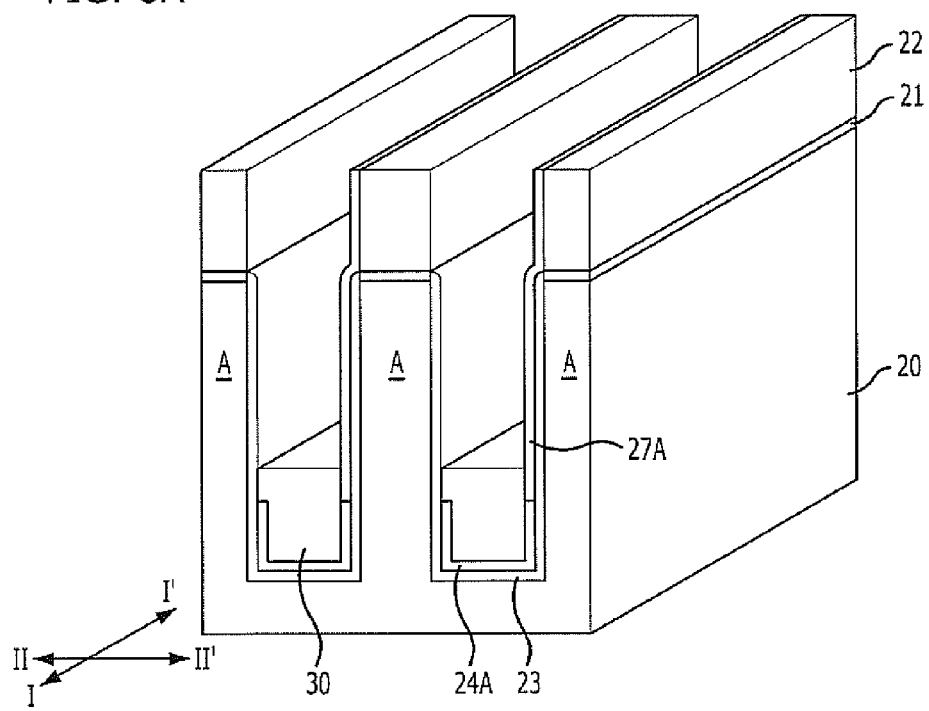
Figure 6B:
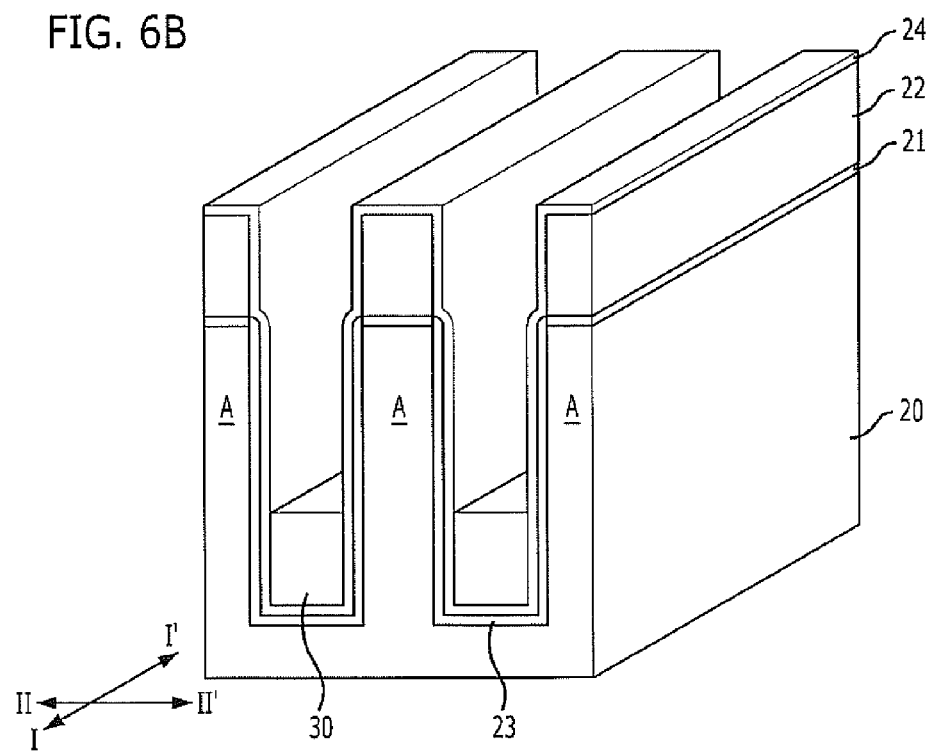

Referring to FIGS. 6A and 6B, the patterned first sacrificial layers 25 and the patterned second sacrificial layers 28 are removed. A third sacrificial layer is buried over the trenches. The third sacrificial layer may include, for example, a polysilicon layer. A planarization process is performed on the third sacrificial layer.

An etch-back process is performed in a manner that the planarized third sacrificial layer remains up to a second height from the bottom surfaces of the trenches. Consequently, patterned third sacrificial layers 30 are formed. The second height has a value greater than that of the first height, which was the height used to form the patterned first sacrificial layers 25. For instance, the difference between the first height and the second height ranges from approximately 250 Å to approximately 400 Å.

Figure 7A:
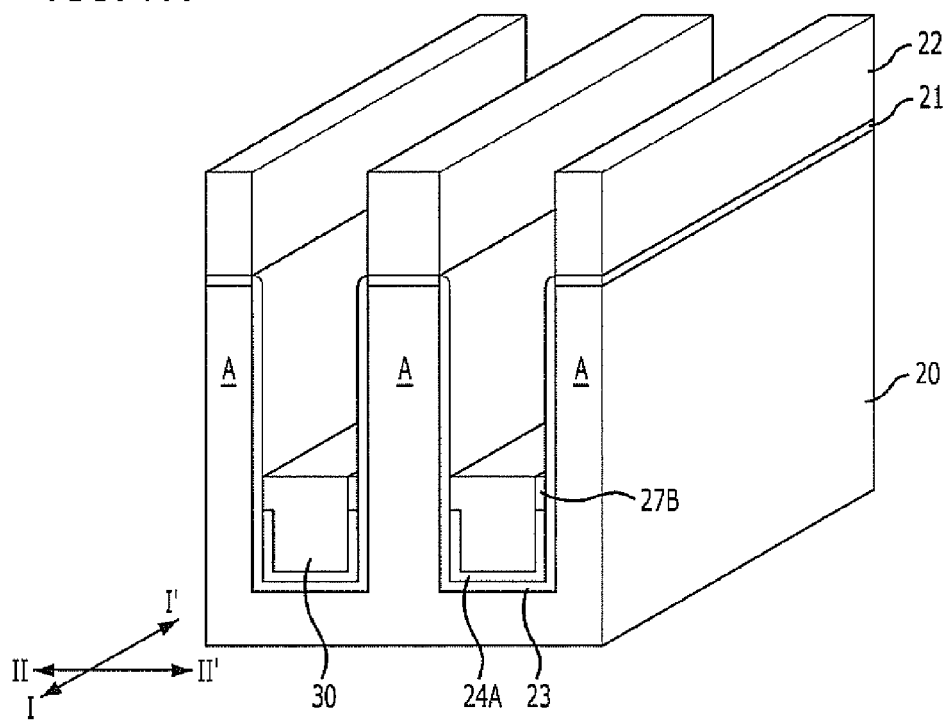
Figure 7B:
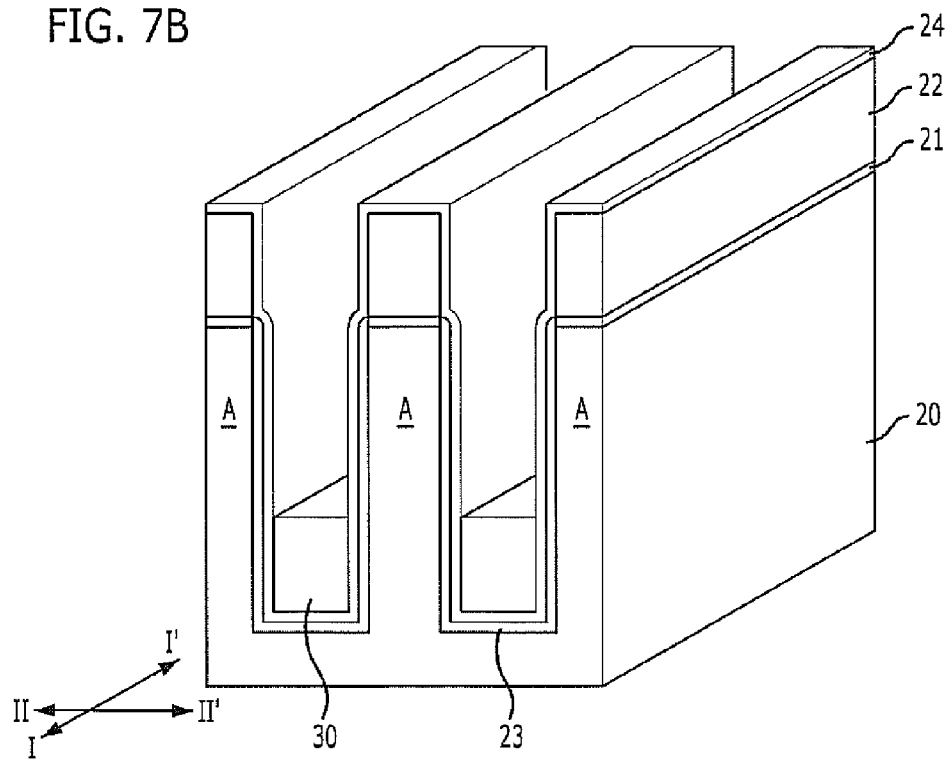

Referring to FIGS. 7A and 7B, portions of the remaining sacrificial liner layers 27A remaining on the inner sidewalls of the trenches in the cell region exposed by the patterned third sacrificial layers 30 are etched. Consequently, sacrificial patterns 27B having a line-form are formed on one of the inner sidewalls of the trenches in the cell region from the first height to the second height.

At this time, the sacrificial patterns 27B are formed over one of the inner sidewalls of the trenches in the cell region.

Figure 8A:
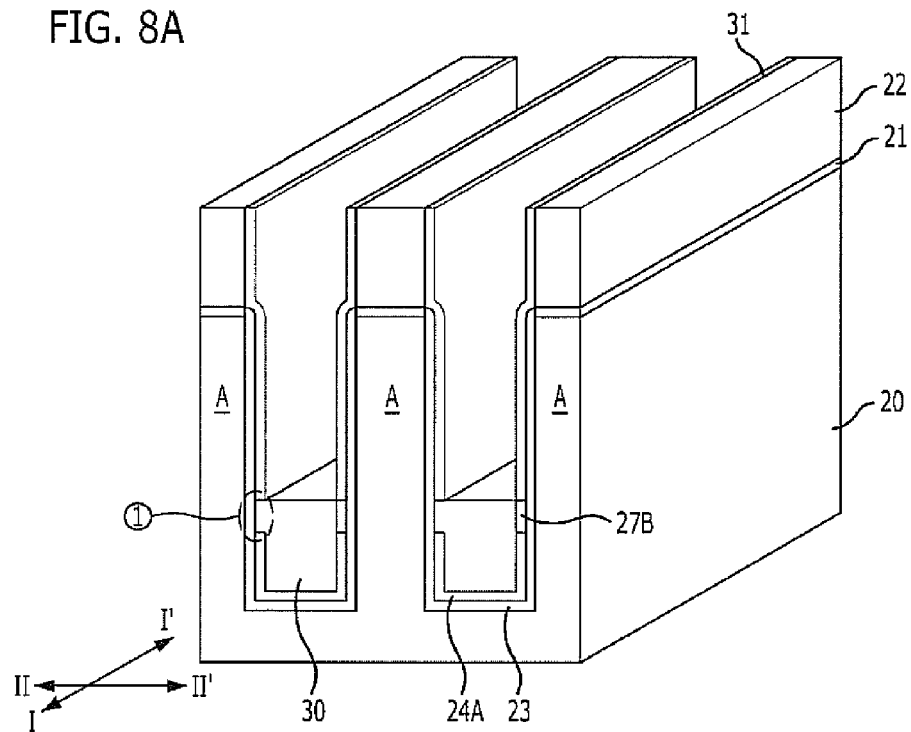
Figure 8B:
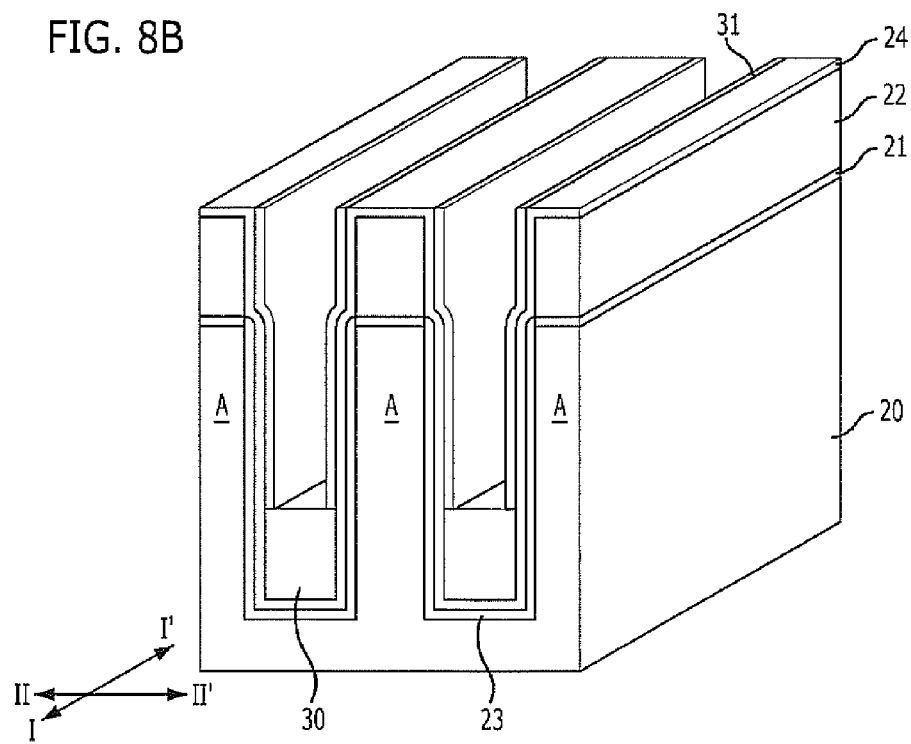

Referring to FIGS. 8A and 8B, second liner layers 31 are formed over the inner sidewalls of the trenches exposed by the patterned third sacrificial layers 30. For instance, the second liner layers 31 may include liner nitride layers.

At this time, portions of one of the inner sidewalls of the trenches in the cell region corresponding to the sacrificial patterns 27B are covered by the patterned third sacrificial layers 30. Thus, the second liner layers 31 are not formed over the portions of one of the inner sidewalls of the trenches in the cell region that are adjacent to the sacrificial patterns 27B.

The portions of one of the inner sidewalls of the trenches where the patterned third sacrificial layers 30 directly contact the sidewall oxide layers 23 are referred to as side contact regions ①. The active regions A are exposed by the side contact regions ①.

Therefore, the side contact regions ① may be defined, in part, by the remaining location of the sacrificial patterns 27B. More specifically, the sacrificial patterns 27B correspond to the side contact regions ①, so that by modifying the height of the sacrificial patterns 27B, the size of the side contact regions ① can be controlled. For instance, the remaining location of the sacrificial patterns 27B may be defined by the first height to which the first sacrificial layer is etched back and the second height to which the third sacrificial layer is etched back. Thus, the remaining location of the sacrificial patterns 27B may be controlled with ease by controlling the etch-back targets, and so the location for forming side contacts may be controlled with ease. Furthermore, the side contacts are formed to have a uniform profile because the location is controlled by the etch-back processes.

Figure 9A:
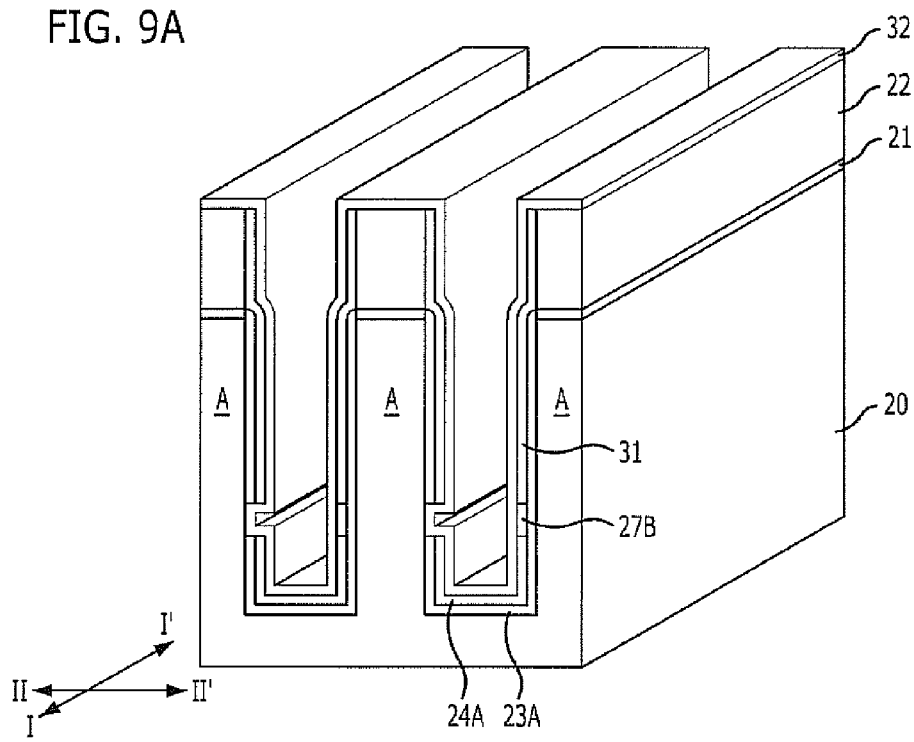
Figure 9B:
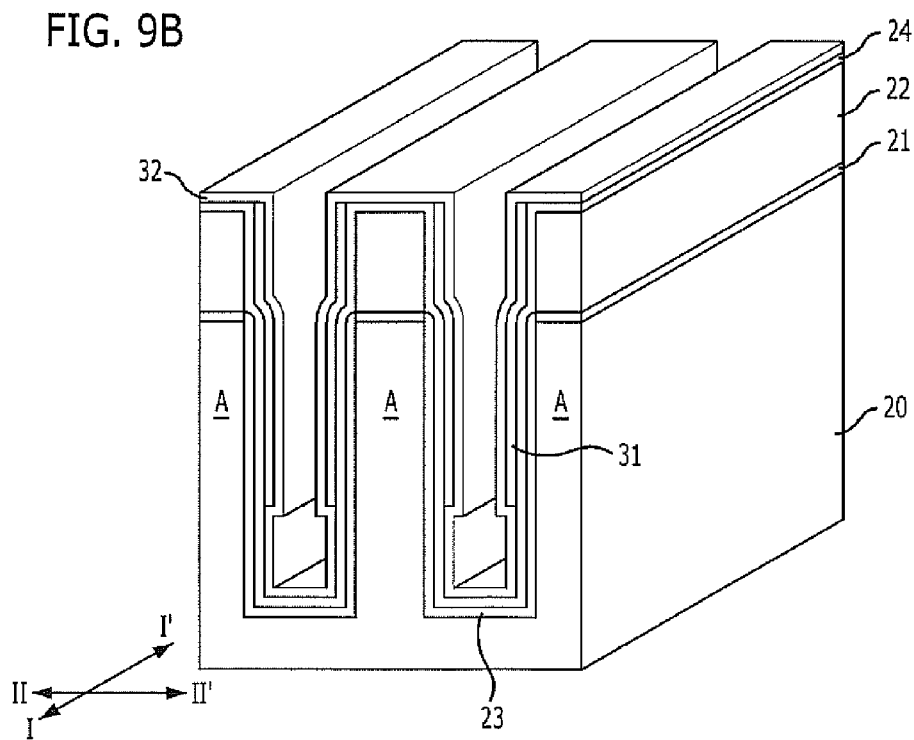

Referring to FIGS. 9A and 9B, the patterned third sacrificial layers 30 are removed to open the side contact regions ①. Portions of the sidewall oxide layers 23 exposed by the remaining first liner layers 24A and the second liner layers 31 are removed. The portions of the sidewall oxide layers 23 are removed using a removal process, and thus, portions of the substrate 20 in the side contact regions ① are exposed.

A side contact conductive layer 32 for forming side contacts is formed over the surface profile of the substrate structure to fill the side contact regions ①. For instance, the side contact conductive layer 32 includes a metal which may be silicided so that junctions are formed in the active regions A by forming a subsequent doped polysilicon layer and performing a thermal treatment process. For example, the side contact conductive layer 32 may include TiN, Co, and Ni.

Figure 10A:
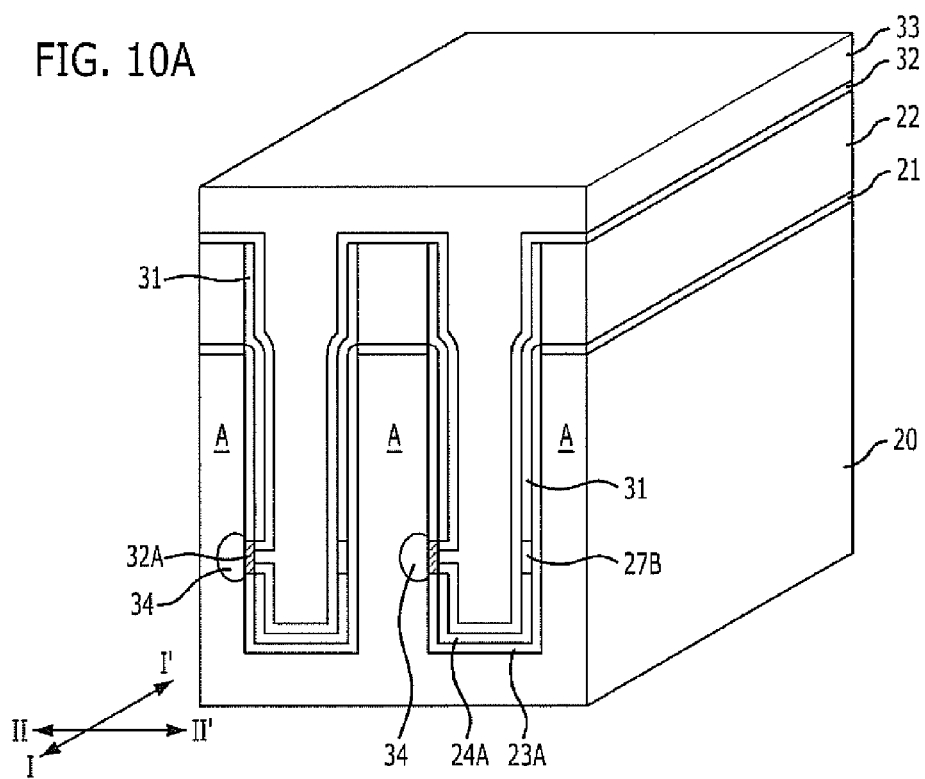
Figure 10B:
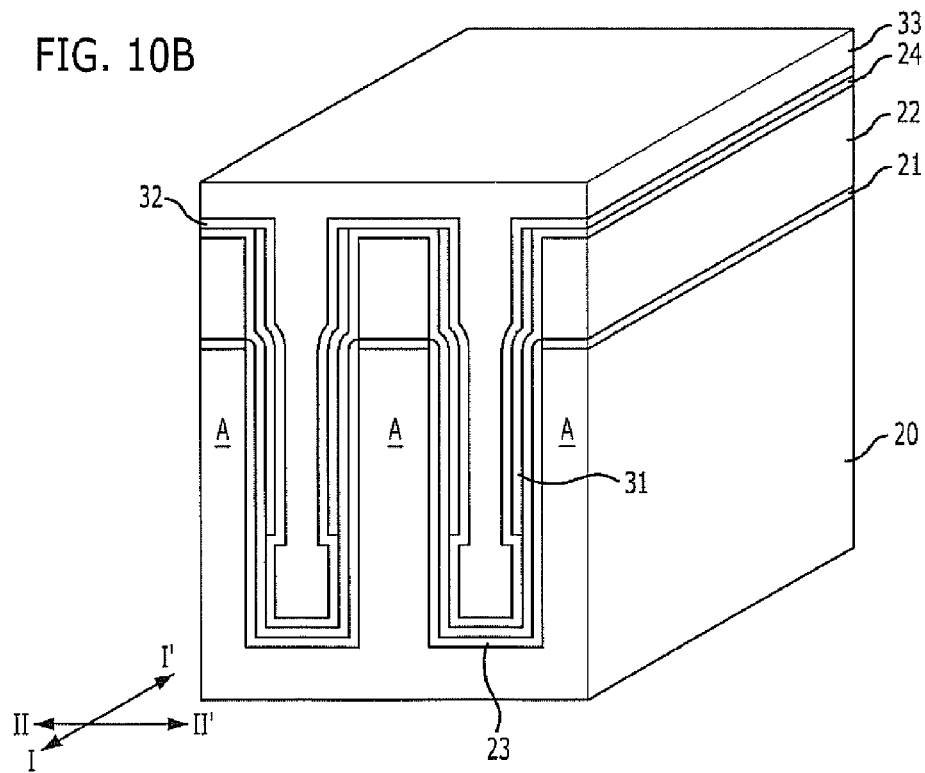

Referring to FIGS. 10A and 10B, a doped polysilicon layer 33 is formed over the substrate structure. The doped polysilicon layer 33 is to be used as a source for a silicidation process of side contacts and junctions.

Next, a thermal treatment process is performed. At this time, portions of the side contact conductive layer 32 formed in the side contact regions ① are silicided, and thus, side contacts 32A having a line form are formed on one of the inner sidewalls of the trenches in the cell region, extending parallel to each other along the first direction I-I'.

Furthermore, dopants included in the doped polysilicon layer 33 diffuse into the active regions A in contact with the side contacts 32A to form junctions 34 in portions of the substrate 20 in contact with the side contacts 32A. That is, the silicided side contacts 32A and the junctions 34 are formed in the cell region. On the other hand, the side contact regions ① are not formed in the edge region, and thus, the dopant diffusion is prevented in the edge region because the first liner layer 24 functions as a barrier. Therefore, the junctions 34 are not formed in the edge region as well.

Figure 11A:
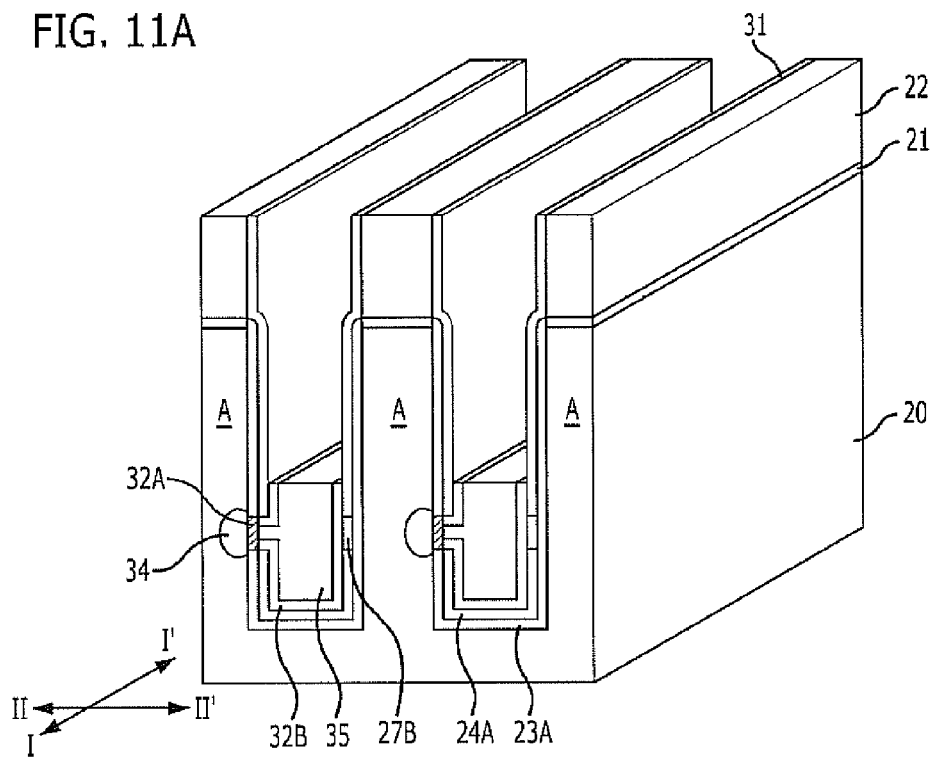
Figure 11B:
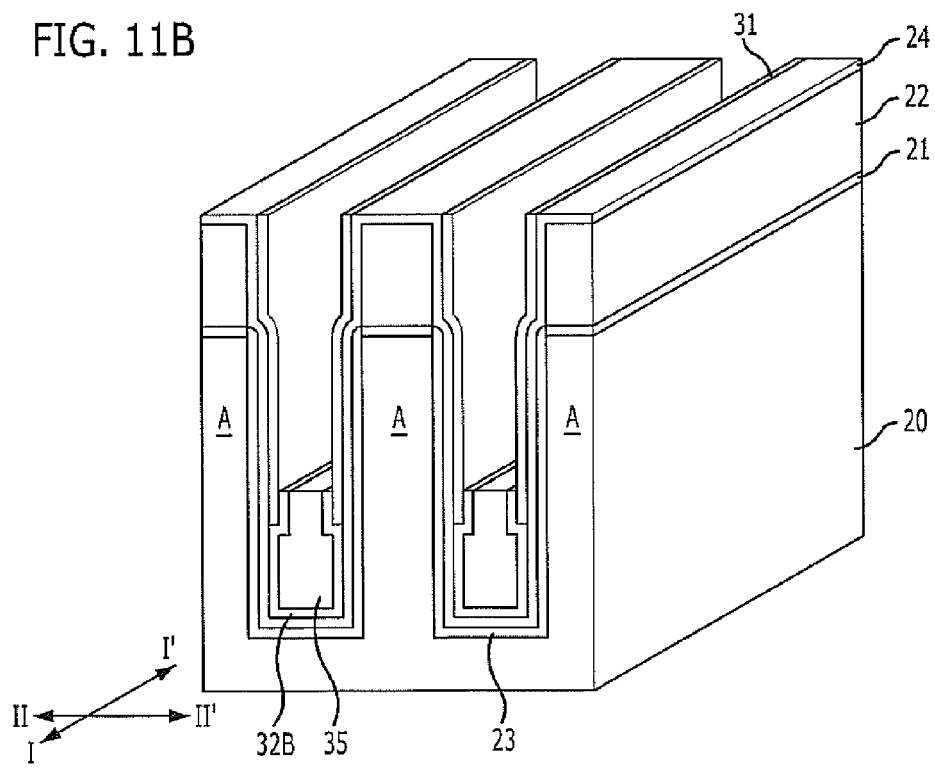

Referring to FIGS. 11A and 11B, the doped polysilicon layer 33 is removed. A buried bit line conductive layer for forming buried bit lines is formed over the substrate structure. An etch-back process is performed on the buried bit line conductive layer and the side contact conductive layer 32 up to a third height higher than a second height to form buried bit lines 35 coupled to the side contacts 32A. Thus, remaining side contact conductive layers 32B are formed.

The buried bit lines 35 may include a double layer. For instance, the buried bit lines 35 may be formed by forming a titanium (Ti)/TiN layer and a tungsten (W) layer and performing an etch-back process.

Although not illustrated, a removal process for removing the second liner layers 31 remaining in the trenches is performed.

In accordance with the first embodiment of the present invention, the liner nitride layer is formed over the surface profile of the trenches, and the liner nitride layer is selectively removed to form the side contact regions opening one of the inner sidewalls of the trenches in the cell region in a line form. Thus, the silicided side contacts and the junctions are formed in the cell region.

Furthermore, in accordance with the first embodiment of the present invention, the sacrificial liner layers are used to define the side contact regions. Thus, the side contacts may be formed on one of the inner sidewalls of the trenches in the cell region with ease.

FIGS. 12A to 20B illustrate perspective views of a method for fabricating a semiconductor device in accordance with a second embodiment of the present invention. FIGS. 12A, 13A, 14A, 15A, 16A, 17A, 18A, 19A, and 20A represent cell regions, and FIGS. 12B, 13B, 14B, 15B, 16B, 17B, 18B, 19B, and 20B represent edge regions.

Figure 12A:
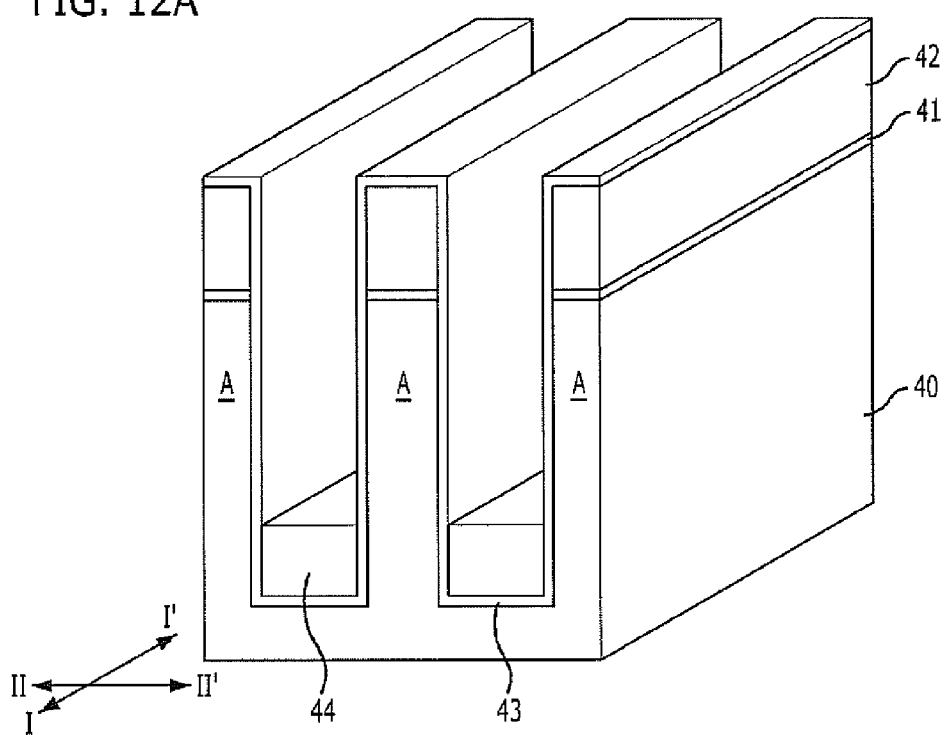
FIGS. 12A to 20B illustrate perspective views of a method for fabricating a semiconductor device in accordance with a second embodiment of the present invention.
Figure 12B:
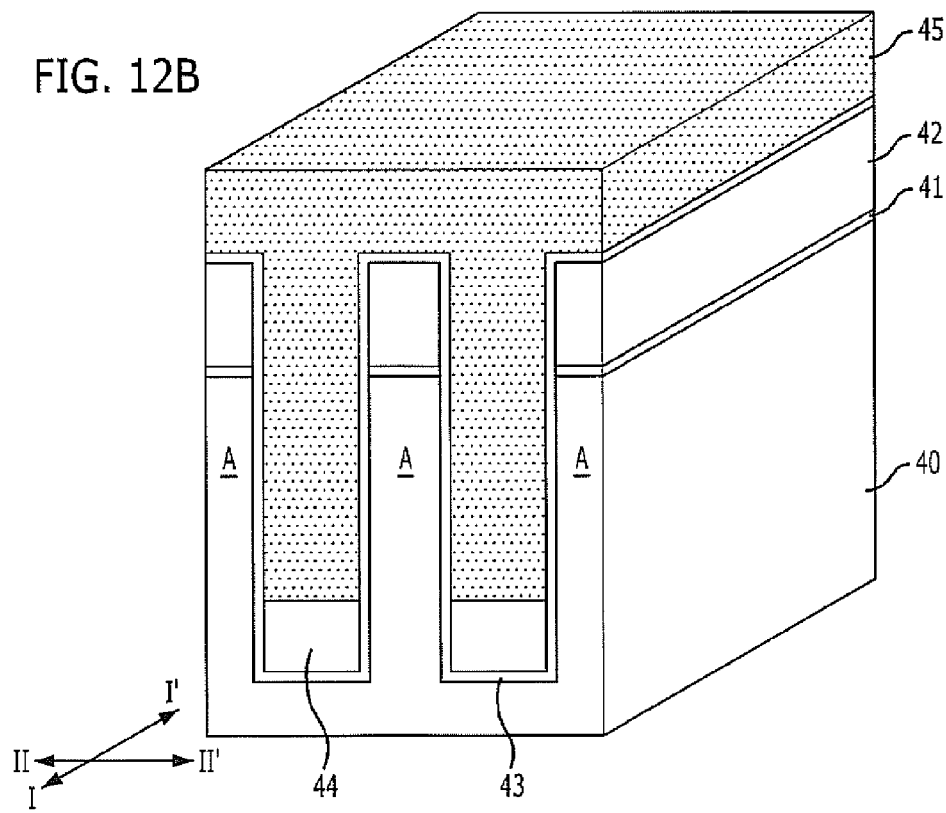

Referring to FIGS. 12A and 12B, a substrate 40 including a cell region and an edge region is formed. The cell region is a region where memory cells for storing data are to be formed. The edge region is a region where pads for contact are to be formed.

A padding pattern 41 and a hard mask 42 are formed over the substrate 40 including the cell region and the edge region. In detail, a padding layer and a hard mask layer are formed over the substrate 40 including the cell region and the edge region. For instance, the padding layer includes an oxide-based layer, and the hard mask layer includes a nitride-based layer.

A mask pattern (not shown) for forming buried bit lines is formed over the hard mask layer. For instance, the mask pattern for forming buried bit lines includes a plurality of line type patterns extending parallel to each other along a first direction I-I'.

The hard mask layer and the padding layer are etched using the mask pattern for forming buried bit lines as an etch barrier, and the substrate 40 is etched to a certain depth to form trenches for forming buried bit lines. The trenches for forming buried bit lines are referred to as trenches hereinafter. For instance, the trenches are formed to a depth ranging from approximately 2,000 Å to approximately 3,000 Å. As a result, the padding pattern 41 and the hard mask 42 are formed.

Consequently, a plurality of active regions A isolated from each other by the trenches and extending parallel to each other along the first direction I-I' are defined. In this embodiment of the present invention, side contacts in a line pattern are formed on sidewalls of the active regions A (i.e., on one of the inner sidewalls of the trenches) using subsequent processes to couple the active regions A and buried bit lines.

A first liner layer 43 is formed over the surface profile of the trenches. For example, the first liner layer 43 may include a liner nitride layer. At this time, the first liner layer 43 is formed without performing a wall oxidation process. Therefore, conditions for forming the first liner layer 43 may be controlled in a manner to reduce a stress between the first liner layer 43 and the substrate 40.

A first sacrificial layer is formed over the substrate structure. For instance, the first sacrificial layer may include a polysilicon layer.

A planarization process is performed until surfaces of the first liner layer 43 are exposed. An etch-back process is performed in a manner that the etched first sacrificial layer remains up to a first height from the bottom surfaces of the trenches. For instance, the first height ranges from approximately 200 Å to approximately 800 Å from the bottom surfaces of the trenches. Consequently, patterned first sacrificial layers 44 are formed.

A first mask pattern 45 covering the edge region is formed. The first mask pattern 45 is formed in a manner so that the first mask pattern 45 covers the edge region while having an opening to expose the cell region. For instance, the first mask pattern 45 may include a photoresist pattern.

Figure 13A:
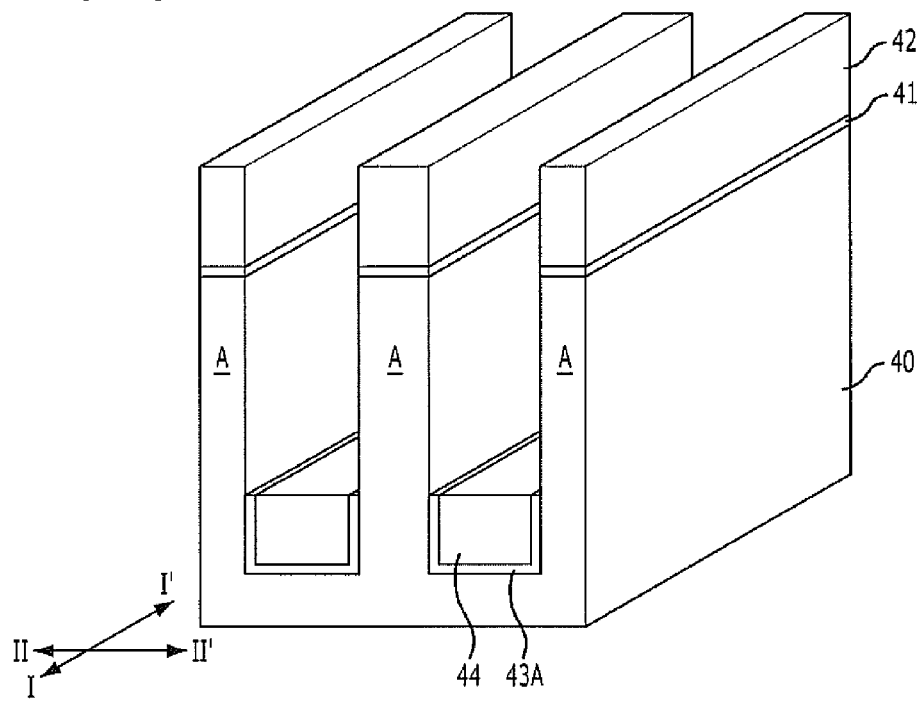
Figure 13B:
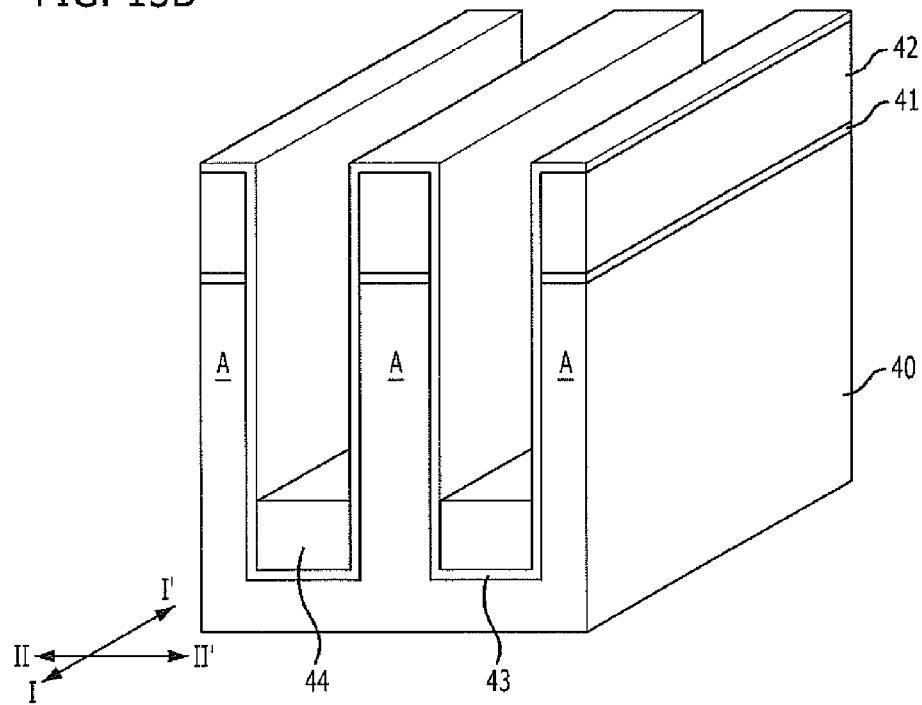

Referring to FIGS. 13A and 13B, exposed portions of the first liner layer 43 are removed using the patterned first sacrificial layers 44 and the first mask pattern 45 as an etch barrier.

For instance, the exposed portions of the first liner layer 43 are removed using a dry or wet removal process. For example, the removal process may be performed using phosphoric acid ($H_3PO_4$) at a temperature ranging from approximately 100° C. to approximately 200° C. for approximately 50 seconds to approximately 200 seconds.

At this time, portions of the first liner layer 43 formed on upper inner sidewalls of the trenches in the cell region are removed while the first liner layer 43 formed over the trenches in the edge region remains after the removal process. Also at this time, portions of the first liner layer 43 formed where the patterned first sacrificial layers 44 are buried over the trenches in the cell region remain after the removal process. Reference denotation 43A represents remaining first liner layers 43A in the cell region.

Consequently, the remaining first liner layers 43A are formed over the bottom surfaces and inner sidewalls of the trenches in the cell region to the first height, while the first liner layer 43 is formed over the entire surface of the trenches in the edge region. Therefore, when forming subsequent doped polysilicon layers for forming subsequent side contacts and performing a thermal treatment process, the first liner layer 43 functions as a barrier in the edge region to prevent formation of junctions through dopant diffusion in the edge region. In other words, the junctions are formed in the cell region, but not in the edge region.

Figure 14A:
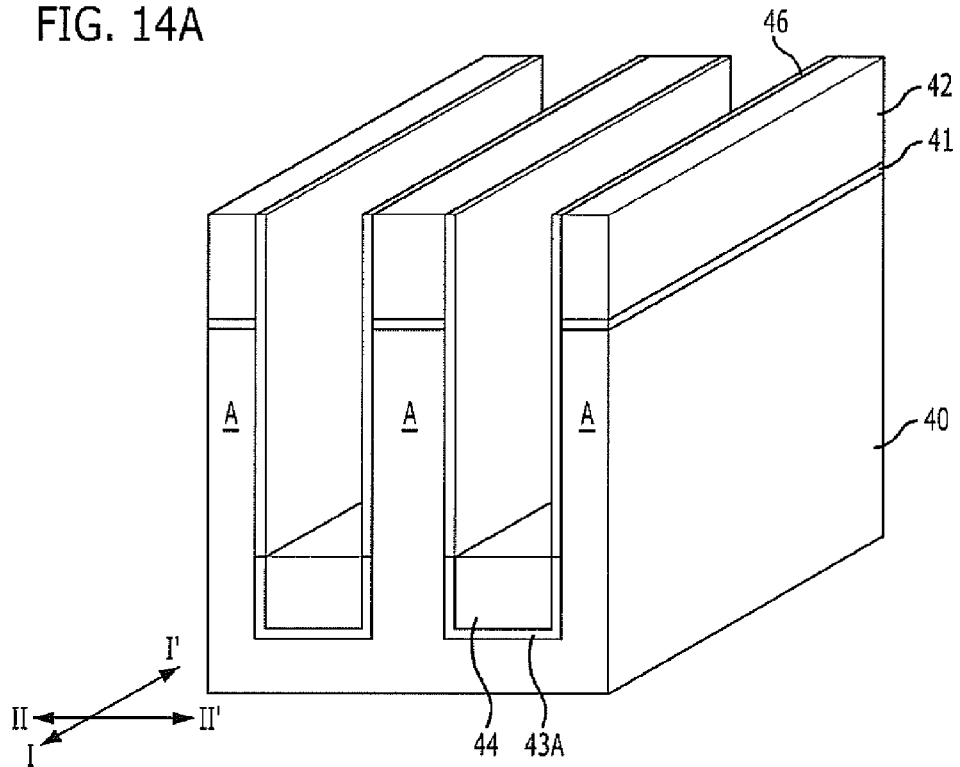
Figure 14B:
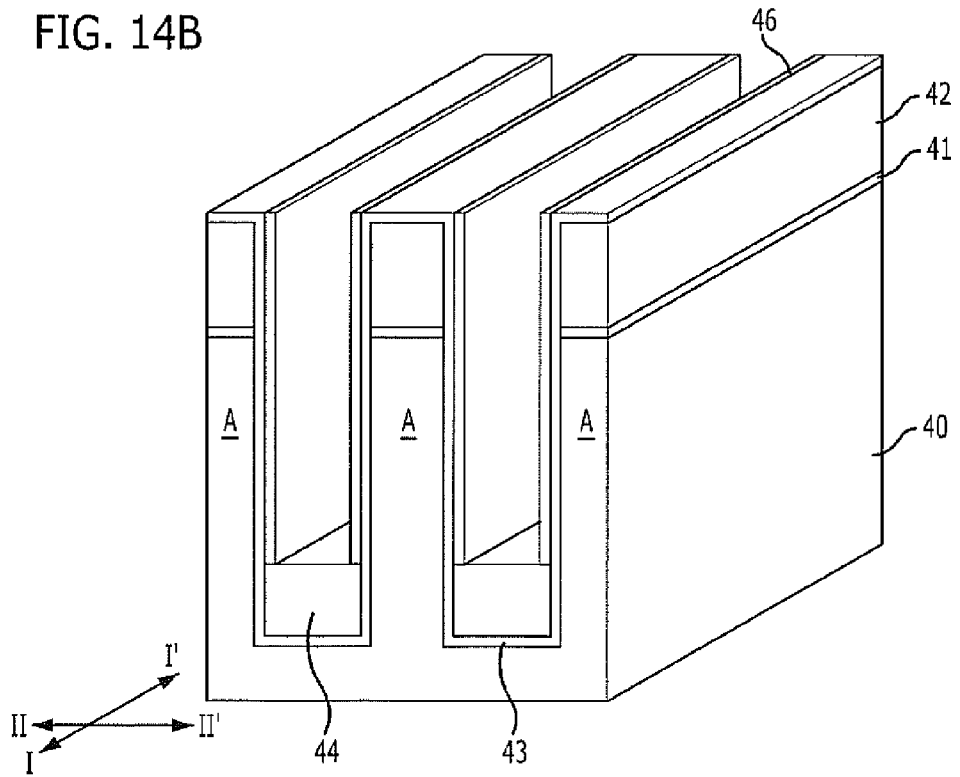

Referring to FIGS. 14A and 14B, a side contact conductive layer for forming side contacts is formed over the surface profile of the trenches. For instance, the side contact conductive layer has a thickness ranging from approximately 10 Å to approximately 200 Å.

An anisotropic etch process is performed to remove portions of the side contact conductive layer formed over the bottom surfaces of the trenches and upper portions of the hard mask 42. Consequently, patterned side contact conductive layers 46 are formed over the inner sidewalls of the trenches.

For instance, the patterned side contact conductive layers 46 include a metal which may be silicided, so that junctions are formed in the active regions A by forming subsequent doped polysilicon layers and performing a thermal treatment process. For example, the patterned side contact conductive layers 46 may include titanium nitride (TiN), cobalt (Co), and nickel (Ni).

Figure 15A:
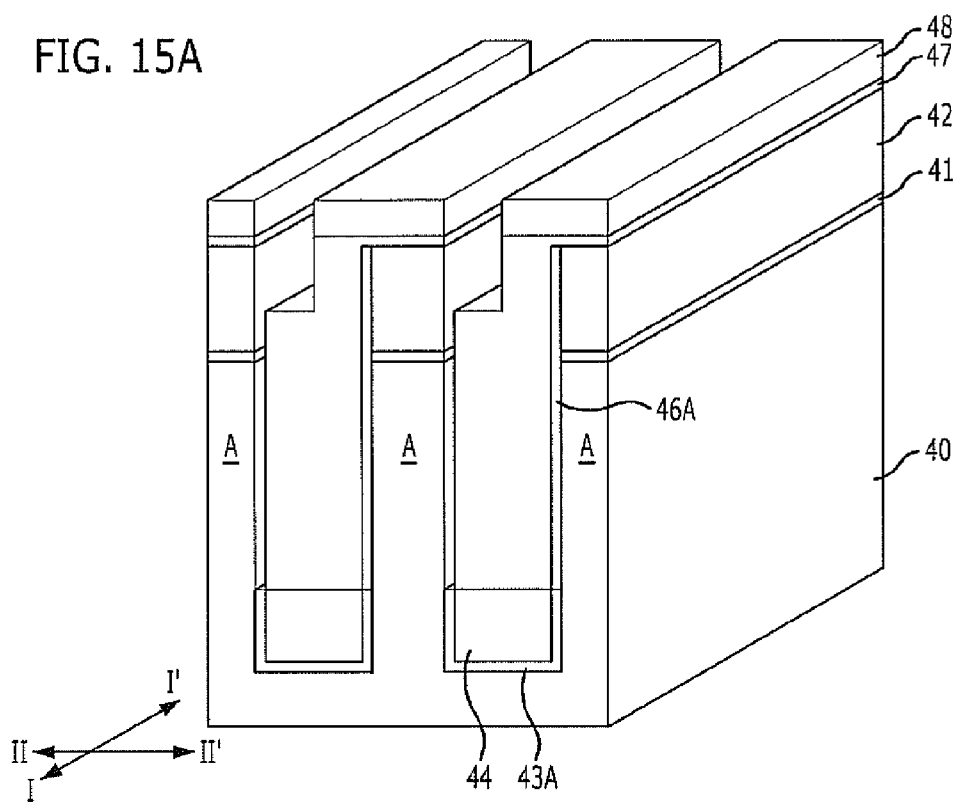
Figure 15B:
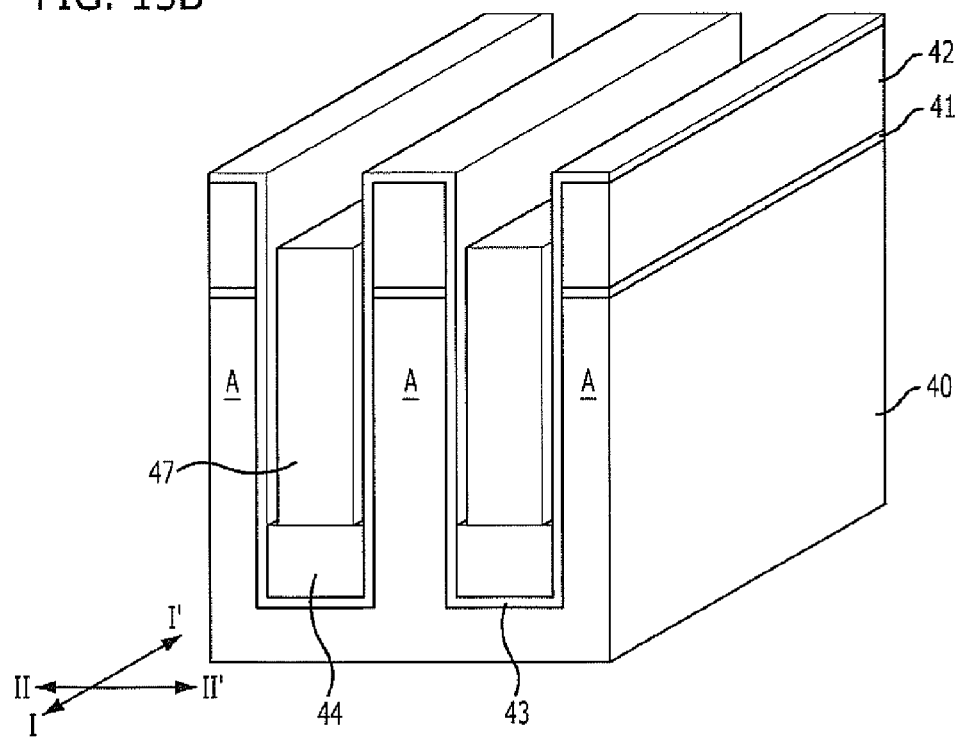

Referring to FIGS. 15A and 15B, a second sacrificial layer is buried over the trenches. For instance, the second sacrificial layer may include a polysilicon layer.

A planarization process is performed in a manner that the planarized second sacrificial layer remains to a certain thickness over the upper portions of the hard mask 42.

A second mask pattern 48 is formed over the planarized second sacrificial layer to cover only one of the inner sidewalls of the trenches in the cell region. For instance, the second mask pattern 48 includes a photoresist pattern, which is formed to expose another inner sidewall of the trenches in the cell region, as well as, the trenches in the edge region.

The planarized second sacrificial layer is etched to a certain thickness to expose portions of the patterned side contact conductive layers 46 using the second mask pattern 48 as an etch barrier. Thus, patterned second sacrificial layers 47 are formed. At this time, portions of the patterned side contact conductive layers 46 formed on one of the inner sidewalls of the trenches in the cell region and the patterned side contact conductive layers 46 formed over the trenches in the edge region are exposed.

Next, for instance, a cleaning process is performed before the exposed portions of the patterned side contact conductive layers 46 are removed.

The exposed portions of the patterned side contact conductive layers 46 are removed using the second mask pattern 48 as an etch barrier. For instance, the exposed portions of the patterned side contact conductive layers 46 may be removed using a wet dip out process.

At this time, the portions of the patterned side contact conductive layers 46 formed on one of the inner sidewalls of the trenches in the cell region and the patterned side contact conductive layers 46 formed over the trenches in the edge region are removed. Reference denotation 46A represents remaining side contact conductive layers 46A remaining on the other inner sidewalls of the trenches in the cell region.

Figure 16A:
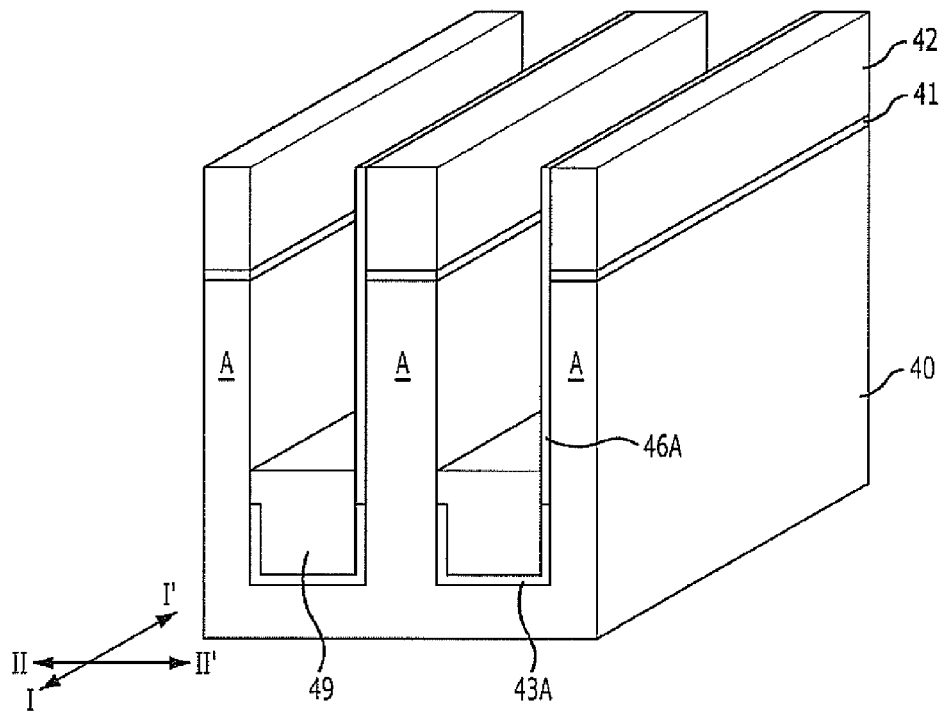
Figure 16B:
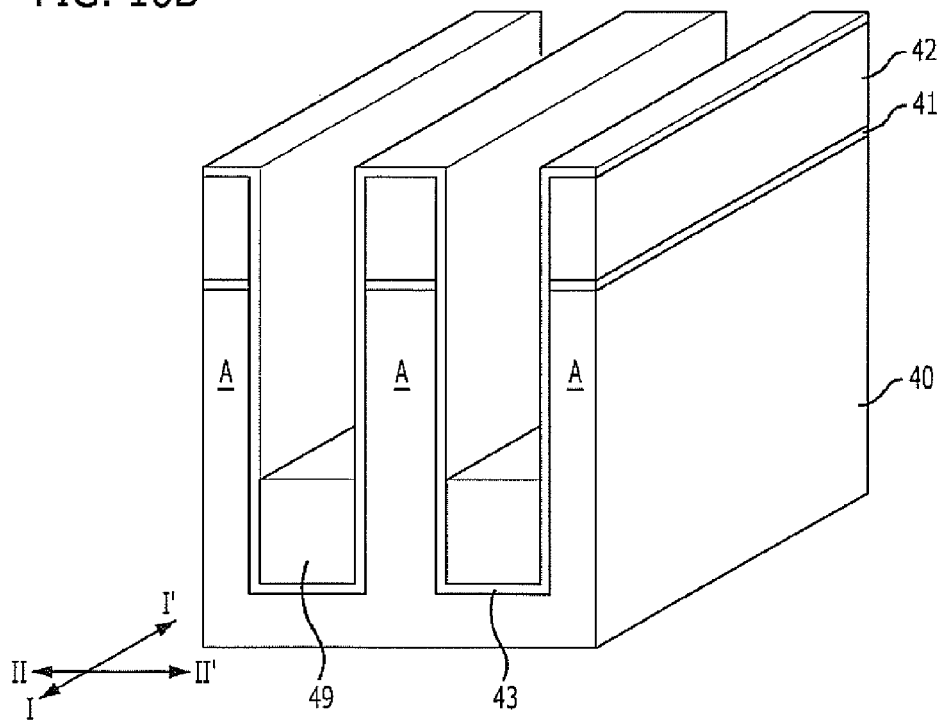

Referring to FIGS. 16A and 16B, the patterned first sacrificial layers 44 and the patterned second sacrificial layers 47 are removed. A third sacrificial layer is buried over the trenches. The third sacrificial layer may include, for example, a polysilicon layer. A planarization process is performed on the third sacrificial layer.

An etch-back process is performed in a manner that the planarized third sacrificial layer remains up to a second height from the bottom surfaces of the trenches. Consequently, patterned third sacrificial layers 49 are formed. The second height has a value greater than that of the first height, which was the height used to form the patterned first sacrificial layers 44. For instance, the difference between the first height and the second height ranges from approximately 250 Å to approximately 400 Å.

Figure 17A:
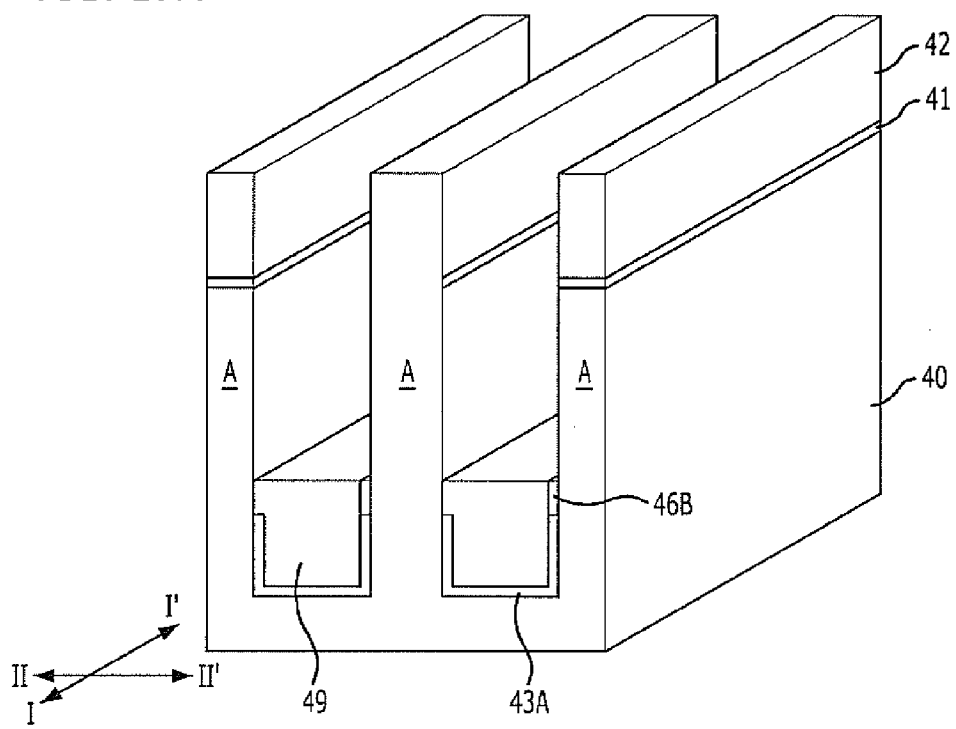
Figure 17B:
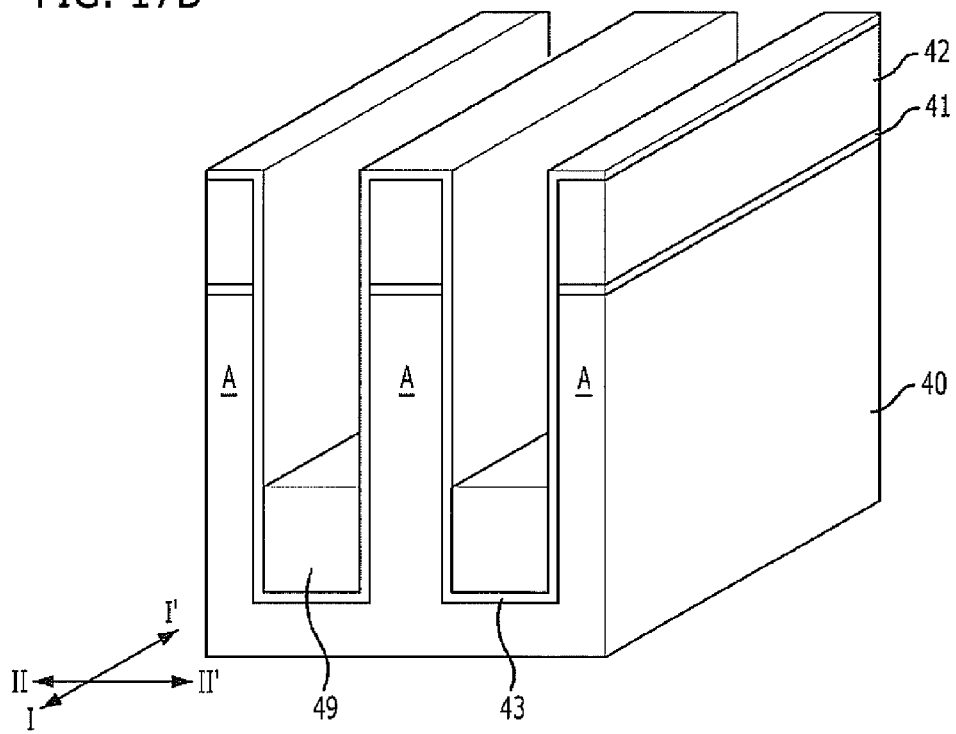

Referring to FIGS. 17A and 17B, portions of the remaining side contact conductive layers 46A remaining on one of the inner sidewalls of the trenches in the cell region exposed by the patterned third sacrificial layers 49 are etched. Consequently, side contacts 46B having a line-form are formed on one of the inner sidewalls of the trenches in the cell region from the first height to the second height.

The location for forming the side contacts 46B is defined by the first height to which the first sacrificial layer is etched back and the second height to which the third sacrificial layer is etched back. Thus, the location for forming the side contacts 46B may be controlled with ease, and the uniformity of the profile of the side contacts 46B may also be improved by controlling the etch-back targets.

Figure 18A:
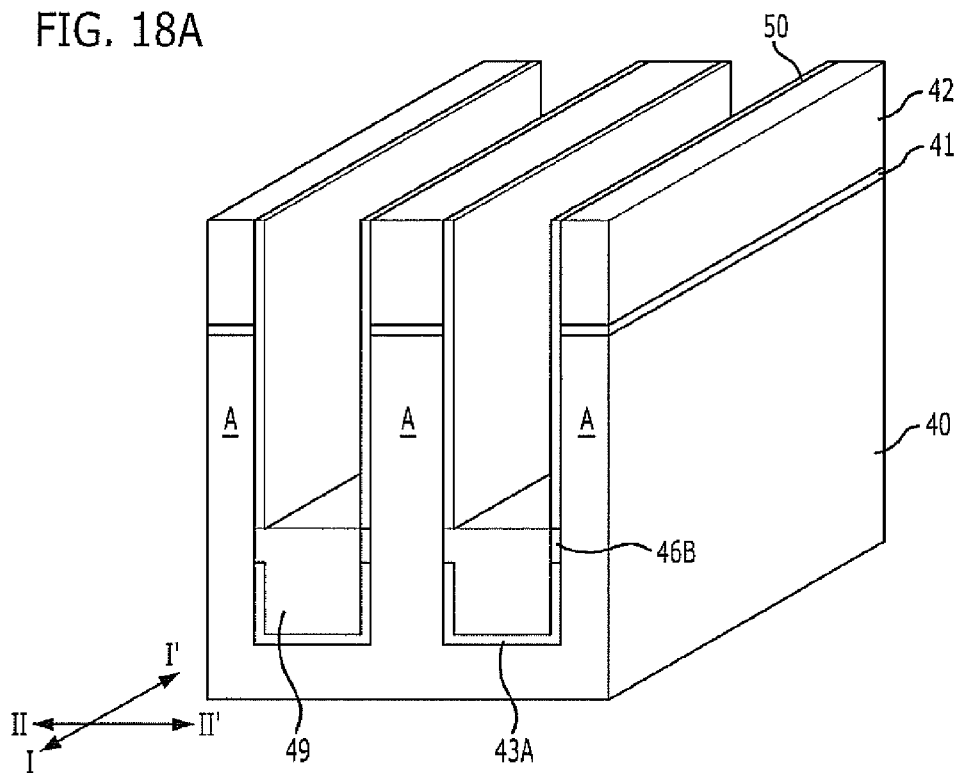
Figure 18B:
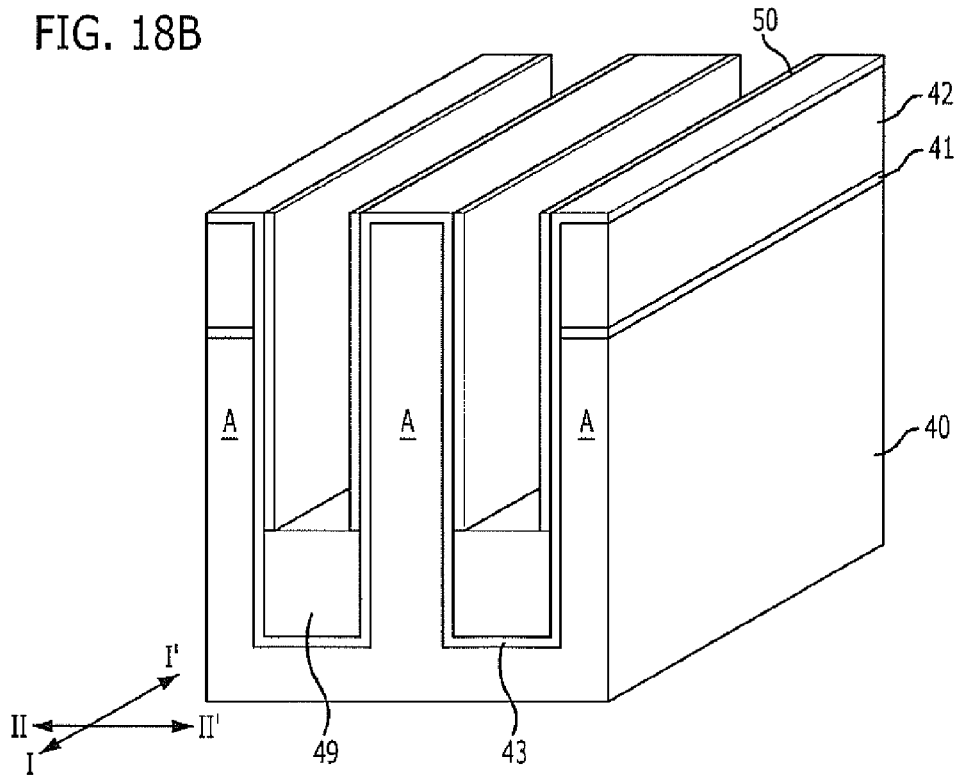

Referring to FIGS. 18A and 18B, second liner layers 50 are formed over the inner sidewalls of the trenches exposed by the patterned third sacrificial layers 49. For instance, the second liner layers 50 may include liner nitride layers.

Figure 19A:
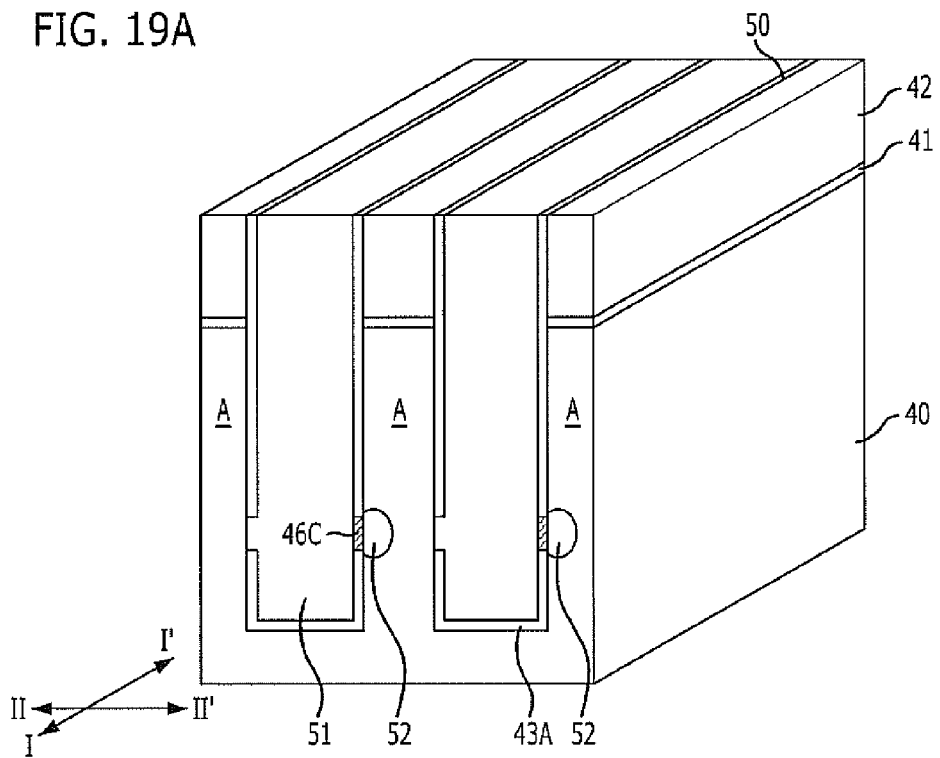
Figure 19B:
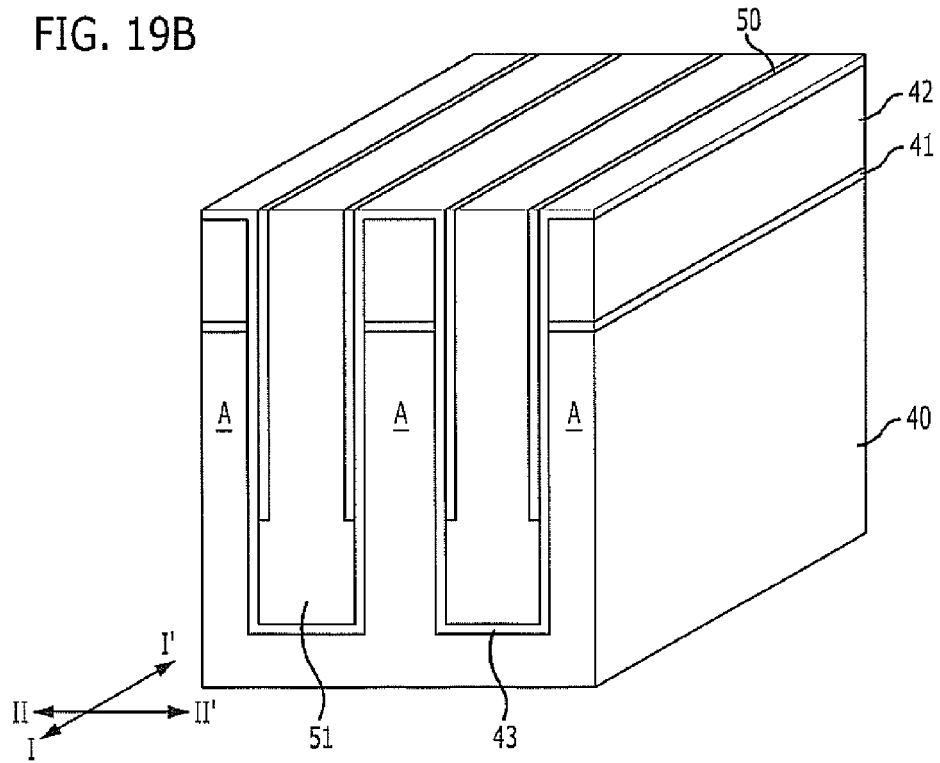

Referring to FIGS. 19A and 19B, the patterned third sacrificial layers 49 are removed. For instance, the patterned third sacrificial layers 49 are removed using a removal process.

Doped polysilicon layers 51 are buried over the trenches. The doped polysilicon layers 51 are to be used as a source for a silicidation process of the side contacts 46B and junctions.

A thermal treatment process is performed. The doped polysilicon layers 51 react with the side contacts 46B by the thermal treatment process, and so the side contacts 46B are silicided. Reference denotation 46C represents silicided side contacts 46C.

Also, the thermal treatment process causes dopants included in the doped polysilicon layers 51 to diffuse into the active regions A in contact with the silicided side contacts 46C to form junctions 52 in portions of the substrate 40 in contact with the silicided side contacts 46C. That is, the silicided side contacts 46C and the junctions 52 are formed in the cell region. On the other hand, because the patterned side contact conductive layers 46 are removed from the edge region, the silicided side contacts 46C are not formed in the edge region, and thus, the junctions 52 are also not formed in the edge region.

Figure 20A:
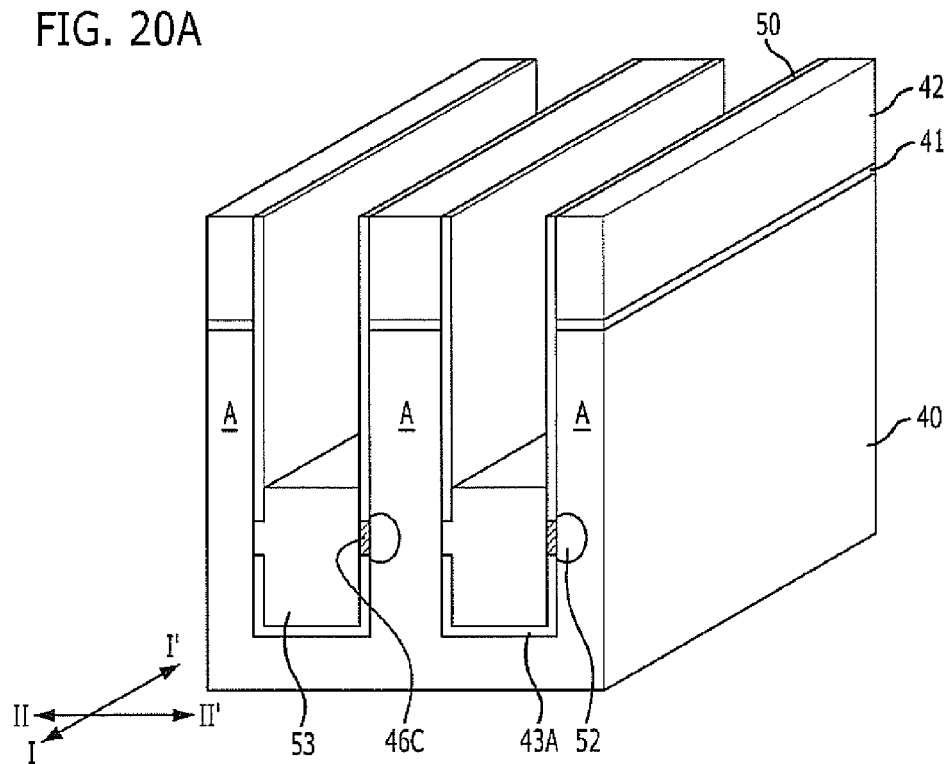
Figure 20B:
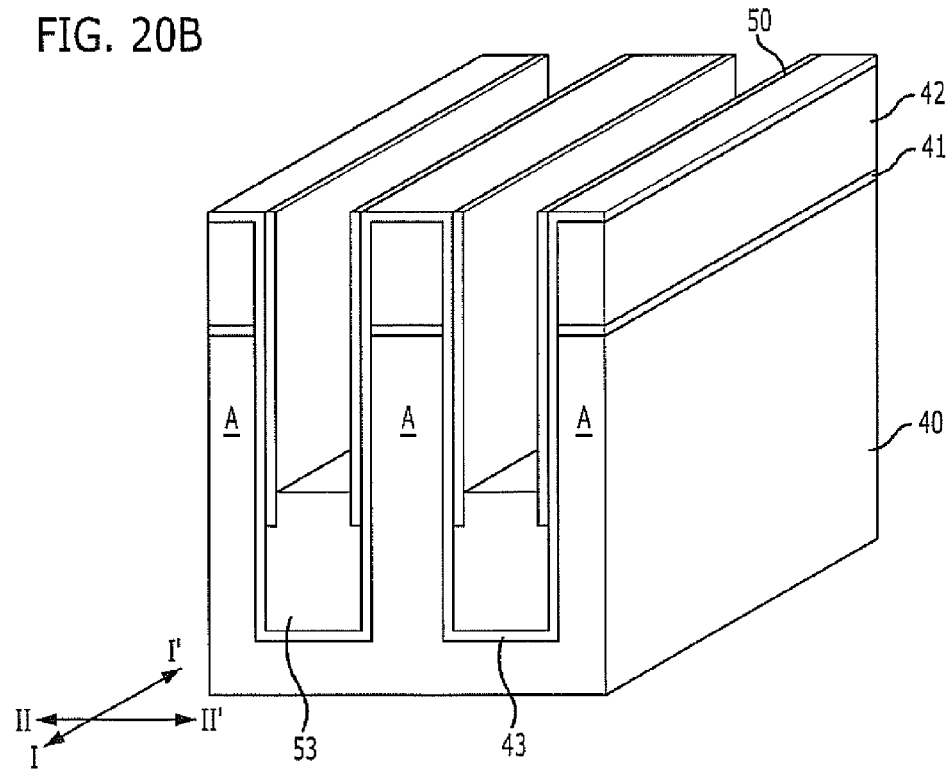

Referring to FIGS. 20A and 20B, the doped polysilicon layers 51 are removed, and a buried bit line conductive layer for forming buried bit lines is formed over the substrate structure. An etch-back process is performed on the buried bit line conductive layer up to a third height higher than a second height to form buried bit lines 53 coupled to the silicided side contacts 46C.

The buried bit lines 53 may include a double layer. For instance, the buried bit lines 53 may be formed by forming a titanium (Ti)/TiN layer and a tungsten (W) layer and performing an etch-back process.

In accordance with the second embodiment of the present invention, the side contacts may be formed on one of the inner sidewalls of the trenches in the cell region by selectively removing the side contact conductive layers formed on the inner sidewalls of the trenches. Thus, processes for removing side contacts formed in the edge region may not be performed, and the side contacts may be formed in the cell region with ease.

According to the embodiments of the present invention, a resistance of buried bit lines may be reduced by forming buried bit lines, including a metal.

Furthermore, the side contacts may be selectively formed in a cell region, generally excluding an edge region. Moreover, side contacts having a uniform profile may be formed with ease.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, comprising:
    etching a substrate including a cell region and an edge region to form a plurality of trenches;
    forming a first liner nitride layer over a surface profile of the trenches;
    forming a mask pattern covering the edge region;
    removing portions of the first liner nitride layer formed on one of inner sidewalls of the trenches in the cell region by using the mask pattern to form side contact regions in the cell region in a line form; and
    forming a side contact conductive layer over the surface profile of the trenches, wherein the side contact conductive layer contacts the inner sidewalls of the trenches through the side contact regions.

2. The method of claim 1, further comprising, performing a sidewall oxidation to form sidewall oxide layers on the inner sidewalls and bottom surfaces of the trenches.

3. The method of claim 2, wherein the removing of portions of the first liner nitride layer to form the side contact regions further comprises:
    removing portions of the first liner nitride layer to expose the sidewall oxide layers formed in the side contact regions; and
    removing portions of the sidewall oxide layers exposed by the removing of the portions of the first liner nitride layer.

4. The method of claim 1, further comprising:
    forming a doped polysilicon layer buried over the trenches having the side contact conductive layer formed therein; and
    performing a thermal treatment process.

5. The method of claim 4, wherein the performing of the thermal treatment process comprises siliciding portions of the side contact conductive layer buried over the side contact regions to form side contacts having a line form on one of the inner sidewalls of the trenches in the cell region.

6. The method of claim 5, wherein the performing of the thermal treatment process comprises diffusing dopants included in the doped polysilicon layer to form junctions in the substrate in contact with the side contacts.

7. The method of claim 5, further comprising, after the performing of the thermal treatment process:
    removing the doped polysilicon layer; and
    forming bit lines buried over portions of the trenches.

8. The method of claim 7, wherein the bit lines buried over the trenches in the cell region are coupled to the side contacts.

9. The method of claim 1, wherein the removing of portions of the first liner nitride layer to form the side contact regions comprises:
    forming first sacrificial layers to a first height in the trenches where the first liner nitride layer is formed;
    forming the mask pattern covering the edge region;
    removing portions of the first liner nitride layer exposed by the first sacrificial layers and the mask pattern;
    forming sacrificial liner layers on the other inner sidewalls of the trenches in the cell region;
    forming third sacrificial layers to a second height, wherein the third sacrificial layers are buried over the trenches where the sacrificial liner layers are formed;
    forming sacrificial patterns in a line form from the first height to the second height by removing portions of the sacrificial liner layers exposed by the third sacrificial layers, wherein the second height is higher than the first height;
    forming second liner nitride layers on the inner sidewalls of the trenches exposed by the third sacrificial layers; and
    removing the third sacrificial layers to form the side contact regions.

10. A method for fabricating a semiconductor device, comprising:
    etching a substrate to form a plurality of trenches;
    forming first liner layers over bottom surfaces and inner sidewalls of the trenches to a first height;
    forming sacrificial liner layers on one of the inner sidewalls of the trenches where the first liner layers are formed;
    forming third sacrificial layers to a second height which is higher than the first height, so that the third sacrificial layers are buried over the trenches where the sacrificial liner layers are formed;
    removing portions of the sacrificial liner layers exposed by the third sacrificial layers to form sacrificial patterns;
    forming second liner layers on the inner sidewalls of the trenches exposed by the third sacrificial layers; and
    removing the third sacrificial layers so that portions of the other inner sidewalls of the trenches from the first height to the second height are exposed in a line form.

11. The method of claim 10, wherein the forming of the first liner layers comprises:
    forming a first liner over a surface profile of the trenches;
    forming first sacrificial layers buried over the trenches to the first height; and
    removing portions of the first liner exposed by the first sacrificial layers.

12. The method of claim 10, further comprising:
    forming a side contact conductive layer over a surface profile of a resultant structure, after the removing of the third sacrificial layers wherein the side contact conductive layer contacts the exposed portions of the other inner sidewalls of the trenches; and
    siliciding portions of the side contact conductive layer contacting the exposed portions of the other inner sidewalls of the trenches to form side contacts.

13. The method of claim 12, wherein the siliciding of the side contact conductive layer to form the side contacts comprises:
    forming a doped polysilicon layer buried over the trenches where the side contact conductive layer is formed;
    performing a thermal treatment process to silicide the portions of the side contact conductive layer contacting the exposed portions of the other inner sidewalls of the trenches; and
    removing the doped polysilicon layer.

14. The method of claim 12, wherein the side contacts are formed on portions of the other inner sidewalls corresponding to portions of one of the inner sidewalls on which the sacrificial patterns are formed.

15. A method for fabricating a semiconductor device, comprising:
    etching a substrate including a cell region and an edge region to form a plurality of trenches;
    forming a first liner layer over a surface profile of the trenches;

forming first sacrificial layers to a first height in the trenches;

forming a mask pattern covering the edge region;

removing portions of the first liner layer exposed by the first sacrificial layers and the mask pattern;

forming sacrificial liner layers on first inner sidewalls of the trenches in the cell region;

removing the first sacrificial layers;

forming third sacrificial layers to a second height which is higher than the first height, so that the third sacrificial layers are buried over the trenches;

removing portions of the sacrificial liner layers exposed by the third sacrificial layers to form sacrificial patterns in a line form on the first inner sidewalls of the trenches in the cell region;

forming second liner layers on the inner sidewalls of the trenches exposed by the third sacrificial layers; and removing the third sacrificial layers to expose portions of second inner sidewalls of the trenches from the first height to the second height in the cell region in a line form, where the second inner sidewalls of the trenches are opposite sidewalls of the same trench as the first inner sidewalls.

16. The method of claim 15, wherein the forming of the sacrificial liner layers on the first inner sidewalls of the trenches in the cell region comprises:

forming sacrificial liners on the first and second inner sidewalls of the trenches exposed by the first sacrificial layers;

forming a mask pattern covering the first inner sidewalls of the trenches in the cell region; and removing exposed portions of the sacrificial liners using the mask pattern.

17. The method of claim 16, further comprising:

forming a second sacrificial layer buried over the trenches, after the forming of the sacrificial liners; and etching the second sacrificial layer to a certain thickness to expose the sacrificial liners using the mask pattern.

18. The method of claim 15, further comprising, after the removing of the third sacrificial layers:

forming a side contact conductive layer over a surface profile of a resultant structure where the third sacrificial lavers are removed, wherein the side contact conductive layer directly contacts the exposed portions of the second inner sidewalls of the trenches; and siliciding portions of the side contact conductive layer contacting the exposed portions of the second inner sidewalls of the trenches to form side contacts.

19. The method of claim 18, wherein the siliciding of the side contact conductive layer to form the side contacts comprises:

forming a doped polysilicon layer buried over the trenches where the side contact conductive layer is formed;

performing a thermal treatment process to silicide the portions of the side contact conductive layer contacting the exposed portions of the second inner sidewalls of the trenches; and removing the doped polysilicon layer.

* * * * *